United States Patent [19]

Baumann

[11] 4,043,819
[45] Aug. 23, 1977

[54] PHOTO-POLYMERIZABLE MATERIAL FOR THE PREPARATION OF STABLE POLYMERIC IMAGES AND PROCESS FOR MAKING THEM BY PHOTOPOLYMERIZATION IN A MATRIX

[75] Inventor: Niklaus Baumann, Marly, Switzerland

[73] Assignee: Ciba-Geigy AG, Basel, Switzerland

[21] Appl. No.: 743,011

[22] Filed: Nov. 18, 1976

Related U.S. Application Data

[63] Continuation of Ser. No. 584,444, June 6, 1975, abandoned.

[30] Foreign Application Priority Data

June 11, 1974 Switzerland ........................ 7956/74
June 11, 1974 Switzerland ........................ 7957/74
Apr. 16, 1975 Switzerland ........................ 4843/75

[51] Int. Cl.$^2$ .......................... G03C 1/68; C08F 2/46
[52] U.S. Cl. ............................. 96/115 P; 204/159.15; 204/159.18; 204/159.23; 96/35.1
[58] Field of Search .................... 96/115 P, 35.1; 204/159.15, 159.18, 159.23, 159.11

[56] References Cited

U.S. PATENT DOCUMENTS

| 3,097,096 | 7/1963 | Oster ........................................ 96/30 |
| 3,615,627 | 10/1971 | Rust ....................................... 96/115 P |
| 3,764,324 | 10/1973 | Reyes et al. ......................... 96/115 P |
| 3,930,868 | 1/1976 | Muzzeyko et al. ................. 96/115 P |

Primary Examiner—John D. Welsh
Attorney, Agent, or Firm—Burgess, Dinklage & Sprung

[57] ABSTRACT

Photopolymerizable material for the preparation of stable polymeric images, is provided which is characterized in that it contains, on a carrier, at least one layer composed of 1. ethylenically unsaturated monomers which are soluble in water or water-alcohol mixtures and which contain one or more terminal double bonds and at least one polar atom grouping with a lone electron pair,
2. a photoinitiator which forms together with an electron donor a photo-redox pair, especially a diazine compound which forms a photo-redox pair with the ethylenically unsaturated monomer (1) or the binder (3a), or with both of them,
3. as a matrix for the monomer (1), a swellable reaction product of at least one
   a. macromolecular binder which is soluble in water or water-alcohol mixtures and which has at least one polar atom grouping containing a lone electron pair, with
   b. a hardener, the hardener being different from the monomers of the component (1), and optionally
4. a chemically inert macromolecular compound which does not react with the binder (3a) or the hardener (3b).

The polymerizable material is useful for recording information, in particular for the preparation of stable polymeric images. The hardened binder (matrix) in which the photo-polymer is embedded imparts to the image a good mechanical strength and a good adhesion to the carrier, so that the polymeric images can be used e.g. as printing plates.

69 Claims, No Drawings

PHOTO-POLYMERIZABLE MATERIAL FOR THE PREPARATION OF STABLE POLYMERIC IMAGES AND PROCESS FOR MAKING THEM BY PHOTOPOLYMERIZATION IN A MATRIX

This is a continuation of application Ser. No. 584,444, filed on June 6, 1975, now abandoned.

It is known to convert monomers into polymers by exposure to light in the presence of a photo-initiator, the polymers resulting from the exposure being distinguished from the original monomers by altered chemical and physical properties and above all, by a reduced solubility in certain solvents. The photo-polymers produced by means of the exposure become insoluble in these solvents, or are, at most, still swellable, that is to say they form, together with the latter, a gel which consists of a network of polymer molecules, the interstices being penetrated by the solvent.

Photo-polymerisable systems of particularly high sensitivity and high quantum yield use free-radical photopolymerisation and, in general, consist of the following constituents:
1. a monomer,
2. a photo-initiator and
3. optionally a macromolecular binder which is soluble in the same solvent as the monomer.

The main purpose of the macromolecular binder in the manufacture of photo-polymerisable materials is to facilitate the uniform distribution of the light-sensitive constituent, which consists of the monomer and the photo-initiator, on a substrate. The macromolecular binder can serve here, distributed on the substrate as a separate layer, as an adhesion promoter between the monomer and the substrate, or it can also serve, mixed with the monomer, as a skeleton substance or matrix for the monomer and the photo-polymer produced therefrom on exposure. In some cases the two effects are combined, that is to say an adhesion layer is first applied to the substrate and a layer consisting of the photo-polymerisable system with a macromolecular binder is applied on top of this. This viscosity of the solution of the macromolecular binder, which is increased as compared with the pure solvent, facilitates the formation of a uniform layer with good adhesion, using the customary application processes. Such photo-sensitive systems consisting of one or more layers can then be exposed image-wise according to customary methods. Photopolymerisation then begins in the known manner at the image points struck by the electromagnetic radiation, the polymer being formed from the monomer as a result of the photo-initiation. Thus the layer contains a latent image. The exposed image points differ from the non-image points in their physical properties, in particular in their solubility properties, and they can be made optically visible by a subsequent treatment, for example by dissolving out the monomer. The macromolecular binder is also dissolved out. The photo-polymer formed by exposure then remains in existence at the exposed image points and possibly forms a relief.

The image produced after developing is in general not visible, or only poorly visible, on simple observation. Various known methods can be used to render it visible. Thus it is possible, for example, to vary the light absorption, by dyeing with suitable dyestuffs, in such a way that the image points become visible through optical contrast. The altered physical properties, particularly the refraction of light, also enable the image to be rendered visible by phase-contrast methods.

In the preparation of polymeric images according to the processes known hitherto (compare, for example, U.S. Pat. Nos. 2,875,047, 3,097,096 and 3,615,627) it is customary to wash out, during developing, the macromolecular binder, which is not light-sensitive and may be present in the monomer layer, together with the unpolymerised fraction of monomer, so that the remaining polymeric image consists exclusively of the photopolymer formed during exposure. The mixtures which are described in the Patent Specifications quoted and are subjected to a photo-polymerisation, optionally can contain polyfunctional monomers as well as difunctional monomers. These copolymerise with linear units of the growing polymer chain, forming a more or less rigid network. Monomers of this type, however, do not show any activity at all towards the customary binders, that is to say gelatine or polyvinyl alcohol are not chemically affected (hardened) in the presence of these comonomers.

Hence, various disadvantages are apparent in this procedure. Above all, the resistance of the polymeric image towards mechanical stress is thus low. This can manifest itself either in inadequate strength of the raised points of the polymeric image or in poor adhesion to the substrate. In a typical manner, these disadvantages are found, for example, in photo-polymers produced from derivatives of acrylic acid which are soluble in water or alcohol. The reason presumably is to be found in an incomplete polymerisation of the monomers to form a solid. Polymers of low molecular weight are then produced, at least in part, due to termination of the chains (see, for example, R. H. Yocum and E. Nyquist: "Functional Monomers", page 36, New York, 1973 Marcel Dekker Inc.). It is known that the physical properties of short-chain polymers are unsatisfactory in respect of both cohesion and adhesion, and they have, therefore, low resistance to mechanical stress.

It is the object of the present invention to avoid the disadvantages described and to provide a material, for example a photographic material, which is suitable for recording information and yields a polymeric image which is durable and largely resistant to mechanical stress.

The present invention relates to a photo-polymerisable material, suitable for the preparation of stable polymeric images, characterised in that it contains, on a carrier, at least one layer composed of
1. ethylenically unsaturated monomers which are soluble in water or water-alcohol mixtures and which contain one or more terminal double bonds and at least one polar atom grouping with a lone electron pair,
2. as the photo-initiator which, conjointly with the monomer (1) and/or the binder 3a), forms a photoredox pair, a compound having a ring system of the formula

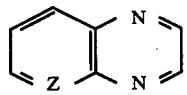
(1)

wherein Z is a nitrogen atom or the group C-R, R is hydrogen or a substituent, and the compound is optionally quaternised, 3. as a matrix for the monomer (1), a swellable reaction product of at least one
   a. macromolecular binder which is soluble in water or water-alcohol mixtures and which has at least one polar atom grouping containing a lone electron pair, with
   b. a hardener for the binder, the hardener being different from the monomers of component (1), and optionally
4. a chemically inert macromolecular compound which does not react with the binder (a) or the hardener (b).

Accordingly, the light-sensitive layer consists of a homogenous solid phase and contains photo-polymerisable monomers, a photo-initiator, hardened binders and, optionally, chemically inert macromolecular compounds. Almost complete reaction between the binder and the hardener takes place during the manufacture of the light-sensitive layer, and the matrix is formed.

The invention also relates to a process for the manufacture of a photo-polymerisable material, suitable for the preparation of stable polymeric images, characterised in that a solution containing 1. ethylenically unsaturated monomers which are soluble in water or water-alcohol mixtures and which contain one or more terminal double bonds and at least one polar atom grouping with a lone electron pair,
2. a photo-initiator which, conjointly with the monomer (1) and/or the binder (3a), forms a photo-redox pair and has a ring system of the formula

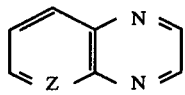

(1)

wherein Z is a nitrogen atom or the group C-R, R is hydrogen or a substituent, and the compound is optionally quaternised, 3a. at least one macromolecular binder which is soluble in water or water-alcohol mixtures and which has at least one polar atom grouping containing a lone electron pair,
3b. a hardener for the binder, the hardener being different from the monomers of component (1), and optionally
4. at least one chemically inert macromolecular compound which does not react with the binder (3a) or the hardener (3b), is applied to a carrier as a layer and dried.

The invention also relates to the use of the photo-polymerisable material in photo-polymerisation processes for the purpose of recording information, in particular for the preparation of stable polymeric images.

The recording of information, in particular the preparation of stable polymeric images, can be carried out, for example, by image-wise exposure, the radiation used being within the wavelength range from 200 to 450 nm. Thereafter, the exposed layer is developed.

During the development of the exposed layer only those fractions of the monomer which are not photo-polymerised, and, optionally, the photo-initiator, are washed out by the solvent, whilst the matrix remains in existence on the entire surface of the layer. The polymeric image, formed during drying, which is carried out at temperatures from about 15° to 30° C, consists only of the matrix at the unexposed points, but at the exposed raised points it consists of the photo-polymer embedded in the matrix. Due to this matrix present across the entire surface, a polymeric image with very good adhesion to the substrate and excellent mechanical strength is obtained. The layer thickness of the light-sensitive layer can be about 1 to 50 μ after drying. The layers have a high transparency which remains preserved even after polymerisation.

It is surprising that, in the process according to the invention the development of the image effected by washing out the monomers is equally as rapid and complete as when the monomers are present in an unprotected layer or are present together with a binder which can also be washed out by the developer (solvent). The only condition for this is that the hardened macromolecular compound, which is not light-sensitive and is used as the matrix, can swell in the developer, so that the monomer which is not photo-polymerised can be reached by the solvent at the non-image points and can be washed out by diffusion. Apparently, the photo-polymer formed during exposure provides the additional volume necessary for the raised points of the polymeric image, whilst the hardened binder, in which the photo-polymer is completely embedded at the image points, imparts to the finished polymeric image the necessary mechanical strength and good adhesion to the substrate.

Furthermore, it is surprising that the raised points of a polymeric image such as is obtained by exposure and developing in accordance with the present invention show chemical and physical differences from the adjacent medium in the same way as a polymeric image produced by a known process. Thus, the image possesses not only a topographically recognisable structure (relief), but for example, the specific affinity for dyestuffs at the points containing the photopolymer remains undiminished even in the matrix. It is, therefore, possible in a simple manner and within a very short time to produce a visible absorption image by treatment with a solution of a suitable dyestuff. In this case, the optical density and the contrast of the image can be controlled at will by suitable selection of the dyestuff and of the concentratin in which the latter is used. Due to the absence of grain, the resolution of the images is excellent, as in the case of the customary photo-polymerisation processes. The polymeric images can also be used as printing plates on account of their high mechanical strength.

Further components, such as wetting agents, such as, for example, ethylene oxide adducts of fatty alcohols, fatty amines, fatty amides or alkylphenols, as well as compounds containing perfluoroalkyl groups, and derivatives thereof, optical brighteners and also plasticisers, such as polyhydric alcohols, high-molecular esters or modified polyethylene oxide derivatives, can be added to the layer-forming liquid mixture.

A large selection of components is available for building up the systems according to the invention, but the components should fulfil the following conditions:

1. The ethylenically unsaturated compound and the photoinitiator together must form a system which polymerises rapidly and with high quantum yield under the conditions prevailing during their use.
2. The macromolecular binder and the hardener must react chemically with one another and thus form a skeleton substance which can be swollen, but no longer dissolved, by the solvent used for developing the image.

3. The solvent and the other components must be so matched to each other that together they form a system which is a homogeneous liquid at least up to the time of applying the layer and during the subsequent drying and in which no segregation or phase separation occurs, so that the non-volatile components are present in the dried layer in a homogenous molecular-disperse division.

The polymerisable ethylenically unsaturated monomers (1), suitable for the process according to the invention, are soluble in water or in water-alcohol mixtures, preferably under neutral conditions, and contain one or more terminal double bonds. They may form a photoredox pair with the photo-initiator (2). Further, the adiabatic ionisation potential of the monomers should be at most 9.5 electron volt. Examples of monomers having a terminal double bond are acrylic acid and methacrylic acid, as well as the salts of these acids with monovalent metals, for example the sodium salts and potassium salts; also unsubstituted or substituted amides of acrylic acid and methacrylic acid, such as, for example, acrylamide, acrylic acid β-hydroxyethylamide, hydroxymethyldiacetoneacrylamide, diacetoneacrylamide and N-alkylamides having 1 to 8 carbon atoms in the alkyl part, such as, for example, N-octylacrylamide; and furthermore N-vinylpyrrolidone, vinylsulphonic acid and sulphoacrylates. If appropriate, mixtures of different monomers can also be used.

Examples of monomers having several terminal double bonds are:

N,N'-Alkylene-bis-acrylamides, bis-acrylamides, tris-acrylamides and divalent or trivalent metal salts of acrylic acid or methacrylic acid.

The monomers of the following formulae should be mentioned individually:

Acrylalkylsulphonic acids of the formulae

2. CH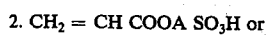

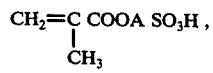

(3)

wherein A is an unbranched or branched alkylene radical with 1 to 6 carbon atoms, for example, —CH₂—, —CH₂CH₂—,

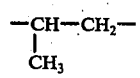

or —(CH₂)₆—.

Alkylene-bis-acrylamides of the formula (4)

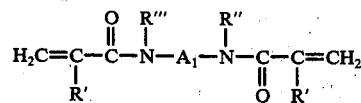

Bis-acrylamides of the formula (5)

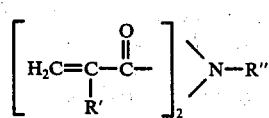

Tris-acrylamides of the formula (6)

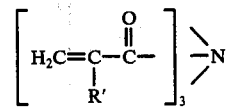

and divalent to trivalent metal salts of the formula (7)

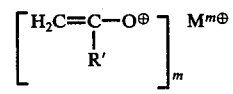

In the formulae (4) to (7), $A_1$ denotes an alkylene group with 1 to 7 carbon atoms, preferably methylene, R' denotes a hydrogen atom or a methyl group, R" and R'" each denote a hydrogen atom or an alkyl group with at most 4 carbon atoms, preferably a methyl group or ethyl group, M denotes a m-valent metal atom and m equals 2 or 3. M preferably is a calcium, barium or strontium cation.

The photo-initiators (2) used in the process according to the invention are optionally quaternised diazine compounds having a ring system of the formula (1); these are, for example, quinoxalines, pyrazines or phenazines, including benzophenazines. They can be prepared in accordance with known methods (in this connection, compare A. C. E. Simpson, Condensed Pyridazine and Pyrazine Rings in A. A. Weissberger, The Chemistry of Heterocyclic Compounds, J. Wiley & Sons, New York (1953); G. A. Swan & D. G. Felton, Phenazines in A. Weissberger, ibid. (1957); Y. T. Pratt in R. C. Elderfield, Heterocyclic Compounds, J. Wiley & Sons, New York 1957, volume 6, page 377 et seq; D. E. Pearson, ibid. page 624 et seq; J. P. Horwitz, ibid. 1961, volume 7, page 720 et seq).

Preferably, diazine compounds of the formulae (8) to (19) are used in the present process:

(8)

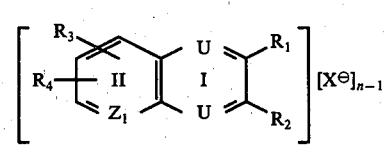

(9)

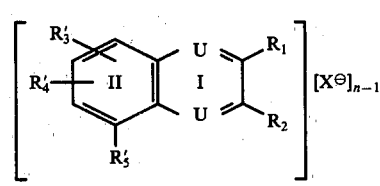

(10)

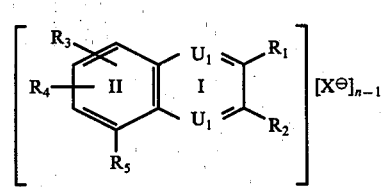

(11)

-continued

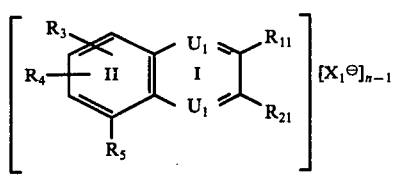 (12)

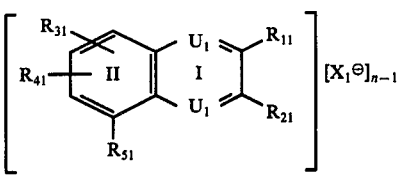 (13)

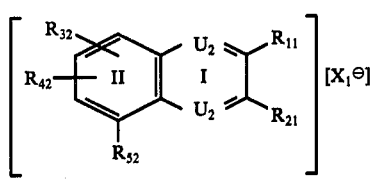 (14)

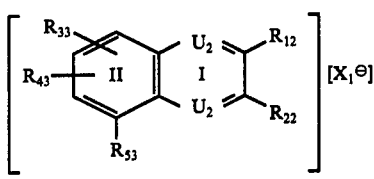 (15)

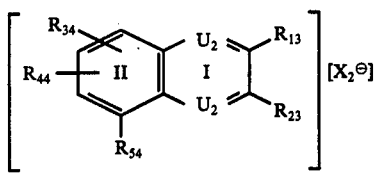 (16)

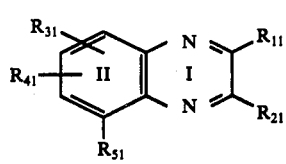 (17)

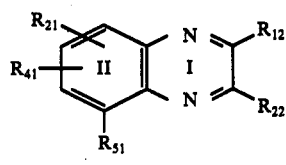 (18)

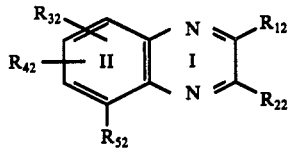 (19)

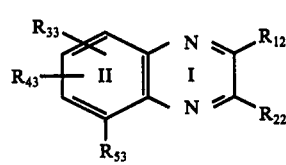

If the compounds of the above formulae (8) to (14) are quaternary

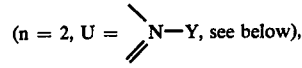

(n = 2, U = \N—Y, see below), two possible isomers of the cation can result in each case, for example:

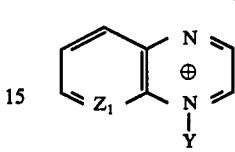 (20.1) and 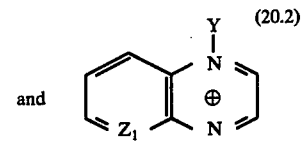 (20.2)

($Z_1 \neq$ CH).

The individual symbols in the formulae have the same meaning throughout, and in particular denote the following:

$n$ —denotes one of the numbers 1 and 2, $Z_1$ —denotes a nitrogen atom or a group

(for $R_5$ see below), $U, U$ —one U denotes a nitrogen atom and the other U, if $n$ is 1, also denotes a nitrogen atom and, if $n$ is 2, denotes a group of the composition

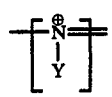

Y —denotes an alkyl radical which is optionally further substituted, $U_1, U_1$ —one $U_1$ denotes a nitrogen atom and the other $U_1$, if n is 1, also denotes a nitrogen atom and, if $n$ is 2, denotes a

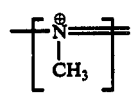

group, $U_2, U_2$ —one $U_2$ denotes a nitrogen atom and the other $U_2$ denotes a

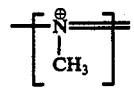

group, $R_1, R_2$ —independently on one another denote a hydrogen atom or an alkyl, alkoxy, aroyl, aryloxy or aralkoxy radical which is optionally further substituted (examples of possible substituents on alkyl groups are halogen atoms and acylamino, acyloxy, hydroxyl, alkoxy, alkylsulphuryl, alkylthionyl, cyano, carboxylic acid alkyl ester and carboxylic acid amide groups, and possible substituents on aryl radicals, preferably benzene radicals, are methyl groups, halogen atoms, such as chlorine, methoxy groups and acylamino, acyloxy, hydroxyl, trialkylsilyl, carboxylic acid alkyl ester, carboxylic acid amide, alkylsulfphuryl, alkylthionyl, aryklsulphuryl, arylsulphonyl, cyano and sulphonic acid groups); or $R_1$ and $R_2$, conjointly with two carbon atoms of the ring I, denote a heterocyclic or isocyclic ring (for example a ring of the formulae

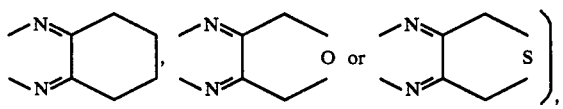

$R_{11}$, $R_{21}$ —denote a benzene radical which is not further substituted or is further substituted (see above, $R_1$, $R_2$), a benzoyl group, a methyl group which is optionally further substituted or a hydrogen atom; or $R_{11}$ and $R_{21}$, conjointly with two carbon atoms of the ring I, denote a five-membered to six-membered heterocyclic or isocyclic ring, $R_{12}$, $R_{22}$—denote a phenyl group, a benzoyl radical, a phenylsulphonic acid group, a methoxyphenyl group, a hydroxymethyl group or a hydrogen atom, $R_{13}$, $R_{23}$ —each denote a phenyl group or each denote a methyl group, $R_3, R_4, R_5$,—independently of one another denote a hydrogen atom, an alkyl, alkoxy, aryloxy or aralkoxy radical which is optionally further substituted (for substituents see above, $R_1$, $R_2$), a halogen atom, a nitro group, a cyano group, a hydroxyl group, an amino group which is optionally further substituted (for example an acylamino group, a monoalkylamino group or a dialkylamino group), an alkylammonium group, acarboxylic acid group, a carboxylic acid amide group, a carboxylic acid alkyl ester group or a sulphonic acid group, or two of $R_3$, $R_4$ and $R_5$, conjointly with two adjacent carbon atoms of the ring II, denote an isocyclic or heterocyclic ring, $R_3', R_4', R_5'$ —one of these three symbols has any desired meaning out of those indicated for $R_3$, $R_4$ and $R_5$, the second denotes a hydrogen atom, a halogen atom, an amino group or an alkyl or alkoxy group and the third denotes a hydrogen atom or an alkoxy group, or two of these symbols are members of a ring of the indicated composition and the third denotes a hydrogen atom or an alkoxy group. An analogous selection of the substituents $R_{31}$, $R_{41}$ and $R_{51}$ is also preferred in the diazine compounds of the formulae (10) to (15) and so on, $R_{31}, R_{41}, R_{51}$ —denote a hydrogen atom, a lower alkyl group, a lower alkoxy group, a chlorine atom, a nitro group, a primary amino group, an acylamino group (such as acetyl-, propionyl- or benzoylamino), a trimethylammonium group, a carboxylic acid amide group which is optionally further substituted by one to two lower alkyl groups, a carboxylic acid group, a carboxylic acid methyl ester group or a carboxylic acid ethyl ester group or a sulphonic acid group, or two of $R_{31}$, $R_{41}$ and $R_{51}$, conjointly with two adjacent carbon atoms of the ring II, denote an isocyclic or a heterocyclic ring (lower alkyl groups are those having at most 4 carbon atoms), $R_{32}$, $R_{42}$, $R_{52}$ — denote a hydrogen atom or a methyl, methoxy, ethoxy, nitro, amino, acetylamino, trimethylammonium or sulphonic acid group or two of $R_{32}$, $R_{42}$ and $R_{52}$, conjointly with two adjacent carbon atoms of the ring II, denote an isocyclic or heterocyclic ring, $R_{33}$, $R_{43}$, $R_{53}$ — denote a hydrogen atom or a methyl, methoxy, ethoxy, nitro, amino, trimethylammonium or sulphonic acid group or two of $R_{33}$, $R_{43}$ and $R_{53}$, conjointly with two adjacent carbon atoms of the ring II, denote a dioxole, dioxane or pyridine ring, $R_{34}$, $R_{44}$, $R_{54}$ — denote a hydrogen atom, a methyl group or a methoxy group, X — denotes an anion, $X_1$ — — denotes one of the anions $Cl^-$, $I^-$, $ClO_4^{31}$, $CH_3SO_4^-$, $FSO_3^-$, $BF_4^-$, $PF_6^-$ and $AsF_6^-$, $X_2$— — denotes one of the anions $I^-$, $ClO_4^-$ and $CH_3SO_4^-$.

Compounds which contain sulphonic acid groups or carboxlyic acid groups can be present not only in the form of their free acids, that is to say with HOOC or $HO_3S$ groups, but also as salts. Depending on the conditions of isolation, for example the selected pH value or the cation which is present in the salt used for isolation, the acid groups can be present as $—SO_3$—cation or —COO—cation groups, such as, for example, $—SO_3Na$, $—SO_3K$, COONa, —COOLi and $—COONH_4$. Thus, apart from the free acids, the compounds are preferably salts of the group of alkaline earth metals or especially the group of the alkali metals. The terms "carboxylic acid" and "sulphonic acid" are here to be understood in this sense.

Reference should also be made to the following publications, in which diazine compounds of the composition initially indicated and processes for their manufacture are described: German Offenlegungsschriften Nos. 2,144,297, 2,144,298, 2,010,280 and 2,360,350.

Examples of anions $(X^-)$ which may be mentioned are: $Br^-$, $Cl^-$, $I^-$, $ClO_4^-$, $CH_3SO_4^-$, $BF_4^-$, $TiF_4^-$, $FSO_3^-$, $AlCl_4^-$, $FeCl_4^-$, $PF_6^-$, $SbCl_6^-$, $SbF_6^-$, $SiF_6^-$, p-toluenesulphonate $^-$, p-chlorobenzenesulphonate $^-$, oxalate $^-$, $SCN^-$, Acetate$^-$, $CH_3SO_4^-$, $HSO_4^-$, $AuCl_4^-$, $SnCl_4^{31\ 2}$, $ZnCl_4^{-2}$, $AsF_6^{31}$ and $AsCl_6^-$.

Water-soluble diazine compounds, especially those which contain sulphonic acid groups, are in general preferred, in particular those having a solubility in water of at least 0.05% (g of diazine in 100 g of aqueous solution) at 20° C.

Examples of such water-soluble diazines are the phenylsulphonic acid quinoxalines of the formula

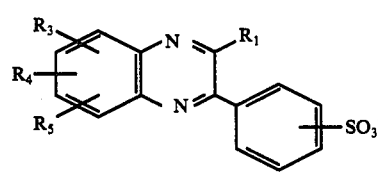

(21)

which can be prepared by treating the appropriate compound, which is free from sulphonic acid groups, with a chlorosulphonic acid at a low temperature and saponifying the sulphonic acid chloride which can be obtained in this way. Thus, a mixture of 2-phenyl-quinoxaline-3'- and -4'-sulphonic acids is obtained which can optionally be separated into its components or can also be used as such for the photopolymerisation in accordance with the invention.

Further suitable compounds are quaternary quinoxaline compounds, for example those of the formulae (22) to (25):

A. Quinoxalinium salts of the formula

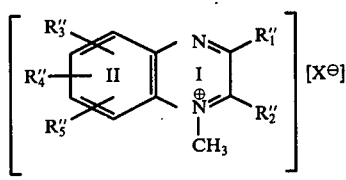
(22)

wherein R"₁ and R"₂ denote hydrogen atoms or alkyl or aryl radicals which are optionally substituted by halogen atoms or alkyl, hydroxyl, alkoxy, nitro, amino, cyano, carboxylic acid, carboalkoxy or carboxylic acid amide groups, R"₃, R"₄ and R"₅ independently of one another denote hydrogen atoms, halogen atoms or alkyl, alkoxy or nitro groups, at least one of R"₃, R"₄ and R"₅ being different from hydrogen and it also being possible for R"₃ and R"₄ or R"₄ and R"₅ conjointly to form the complement for a heterocyclic ring fused to the six-membered ring I, and X denotes an anion.

B. Quinoxalinium salts of the formula

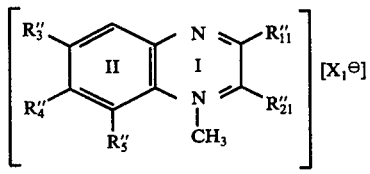
(23)

wherein R"₁, R"₂, R"₃, R"₄, R"₅ and X have the indicated meaning.

C. Quinoxalinium salts of the formula (24)

wherein R"₃, R"₄ and R"₅ have the indicated meaning, R"₁₁ and R"₂₁ denote hydrogen atoms, methyl groups or acetoxymethyl groups or phenyl radicals which are optionally substituted further and X₁³¹ denotes one of the anions Cl⁻, I⁻, ClO₄⁻, CH₃SO₄⁻, FSO₃⁻, BF₄⁻, PF₆⁻ and AsF₆⁻.

D. Quinoxalinium salts of the formula

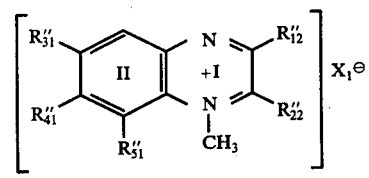
(25)

wherein X₁⁻ has the indicated meaning, R"₁₂ and R"₂₂ denote methyl, acetoxymethyl or phenyl groups, and R"₃₁, R"₄₁ and R"₅₁ independently of one another denote hydrogen atoms, chlorine atoms, methyl groups, methoxy groups, ethoxy groups, benzyloxy groups or nitro groups, at least one of R"₃₁, R"₄₁ and R"₅₁ being different from hydrogen and it also being possible for R"₃₁ and R"₄₁ or R"₄₁ and R"₅₁ conjointly to form the complements for a pyridine ring, dioxole ring or dioxane ring fused to the six-membered ring II.

Quaternary diazine compounds of this and other types can be obtained by quaternisation of the corresponding bases. In particular, compounds of the formula (8), wherein Y denotes an alkyl group and $n$ is 2, can be prepared by alkylation of the corresponding diazines ($n=1$). This alkylation is in general carried out at elevated temperature and under normal or elevated pressure. Examples of suitable alkylating agents are dialkyl sulphates, such as dimethyl sulphate or diethyl sulphate, and alkyl halides, especially iodides, such as methyl iodide or ethyl iodide.

An example of an especially active alkylating agent is CH₃SO₃F, such as has been described by M. G. Ahmed et al. (Chem. Comm. 1968, 1533).

If it is desired for any reason to exchange the anion X⁻ in an initially formed quinoxalinium salt, this can be carried out without difficulty by double decomposition of the quinoxalinium salt with an appropate salt in aqueous solution. If the desired salt does not precipitate directly, the precipitation can be effected by adding an inactive, water-miscible organic solvent. Suitable solvents are alcohols, such as methanol or ethanol, acetone, acetonitrile, tetrahydrofurane, dioxane, 1,2-dimethoxyethane and 1,2-diethoxyethane.

The amount of the diazines to be employed as photo-initiators can be about 0.01 to 5, preferably 0.5 to 3, percent by weight, relative to the weight of the starting monomers to be polymerised.

The macromolecular binders (3a) which are to be used in the process according to the invention and which have at least one polar atom grouping with a lone electron pair, are soluble in water or water-alcohol mixtures, preferably under neutral conditions. Since they optionally can form a photo-redox pair with the photo-initiator too, their adiabatic ionisation potential should be at most 9.5 electron volt. Examples of suitable binders are gelatine, chemically modified gelatine, polyvinyl alcohols and hydrolysed copolymers of olefines with maleic anhydride.

Optionally the binders can also be present in a colloidal form. The binders, such as, preferably, gelatine or chemically modified gelatine, are employed together with a customary hardener (3b). Of course, mixtures of macromolecular compounds which form homogeneous phases can also be used, in which case one of the components is to be regarded as hardenable in the sense of the invention and the other component (4) as chemically inert towards the hardener. A suitable mixture is obtained, for example, from a poly-N-vinylpyrrolione or a poly-N-vinylcarbazole (component (4)) and gelatine, or from polyacrylamides (component (4)) and gelatine.

Possible solvents for the preparation of solutions of the ethylenically unsaturated monomers, to be used in accordance with the invention, and of the macromolecular binders are especially water and/or low-molecular alkyl alcohols having 1 to 4 carbon atoms, such as, for example, methanol, ethanol, propanol, isopropanol, butanol or tert.-butanol. The mixing ratios can be selected as desired and are between (5-95):(95-5), expressed as parts by volume of water and alcohol.

Polyfunctional compounds which can be employed as hardeners (3b) for binders of the type indicated are dealt with on pages 55 to 60 of the book by C. E. K. Mees and T. H. James "The Theory of the Photographic Process" 3rd edition. Suitable hardeners are aldehydes, N-methylol compounds, ketones and also carbonic acid derivatives, such as, for example, polycarbonates, sulphuric acid esters and sulphonyl halides, compounds containing so-called "active halogen", such as, for example, α-chloroketones and α-bromoketones, epoxides, aziridines, active olefines, such as, for example, divinylsulphones, isocyanates, carbodiimides, and also specific acrylic acid compounds and triazine derivatives. In some cases, the hardening effect can be enhanced by the addition of suitable inorganic salts, such as, for example, chromium alum. Examples of suitable hardeners are the following:

1. Halogeno-1,3,5-triazine compounds of the formula

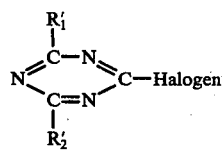

(26)

wherein $R'_1$ denotes an organic radical having at least one acidic group conferring solubility in water and $R'_2$ denotes a halogen atom, an organic radical having an acidic group conferring solubility in water, a hydrocarbon radical or a substituent which is bonded to the triazine ring via an oxygen atom, a sulphur atom or nitrogen atom, and Halogen especially denotes chlorine; preferably halogeno-1,3,5-triazine compounds are used in which at least one of the radicals $R'_1$ and $R'_2$ denotes an oxygen or nitrogen atom bonded to the triazine ring, a hydrocarbon radical, preferably an aliphatic hydrocarbon radical, or a carboxylic acid, sulphonic acid or acidic sulphuric acid ester group. Furthermore, one of the radicals $R'_1 R'_2$ can also be a halogen atom, a hydroxyl group, a methoxy group or an optionally substituted phenoxy or amino group (U.S. Pat. No. 3,288,775).

2. Compounds which contain at least one acidic group conferring solubility in water and at least two α,β-ethylenically unsaturated α-halogenocarboxylic acid amide radicals or at least two α-halogenoacrylic acid amide radicals.

Particularly suitable compounds are those of the formula (27)

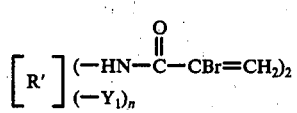

wherein R' denotes an aromatic radical with 1 to 2 benzene rings, $Y_1$ denotes a sulphonic acid group or a carboxylic acid group and n denotes an integer with a value of at most 4 (U.S. Pat. No. 3,444,156).

3. Acrylic acid derivatives of the formula (28)

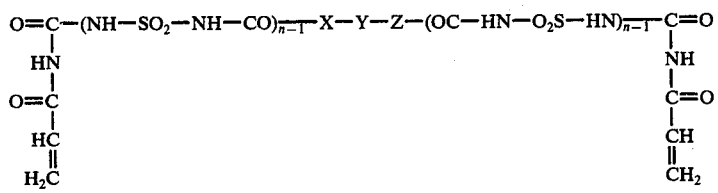

wherein X and Z denote an oxygen atom, a sulphur atom, a —NH— group or a —NH—CO— group bonded via its carbon atom, to Y, and Y denotes a —(CH$_2$)$_m$— group, a —CH$_2$—CH$_2$—[O—CH$_2$—CH$_2$]$_q$— group, a —(CH$_2$)$_r$—O—(CH$_2$)$_r$— group or a —(CH$_2$)$_r$—S—(CH$_2$)$_r$— group, and furthermore Y can represent a direct bond or a —CO— group, if X and Z each denote —NH— groups and n is 1, n, m, r and q denoting positive integers and n being at most 2, m being at most 14, q beng 2 to 4 and r being at most 4(U.S. Pat. No. 3,455,893).

4. Compounds of the formula $$[A—CH=CH—E^\oplus] \, X^\ominus$$ (29)

wherein A denotes an aldehyde group or a functionally modified aldehyde group, E+denotes an ammonium, phosphonium or sulphonium radical and X+denotes an anion.

Compounds which are preferentially suitable are those of the formula (30)

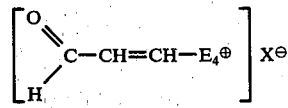

wherein $E_4$+represents an ammonium radical, the quaternary nitrogen atom of which is substituted by alkyl or cyanoalkyl, the alkyl radical in each case containing 1 to 18 carbon atoms, by a six-membered cycloaliphatic radical or by a benzyl radical, or the quaternary nitrogen atom being part of a five-membered or six-membered aliphatic ring, which optionally also contains nitrogen, oxygen or sulphur as further hetero-atoms, or of a pyridine ring which is optionally substituted by halogen or alkyl having 1 to 5 carbon atoms, and X−is an anion, preferably a halide, perchlorate or fluoborate (U.S. Pat. No 3,792,021).

5. Compounds of the formula (31)

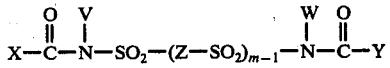

wherein V and W independently of one another denote a hydrogen atom or an organic radical, X and Y independently of one another denote a vinyl group which is optionally further substituted or a group which can be converted into a vinyl group, Z denotes an organic bridge member and m denotes an integer having a value from 1 to 11, or salts of such compounds.

Preferred compounds correspond, for example, to the formula

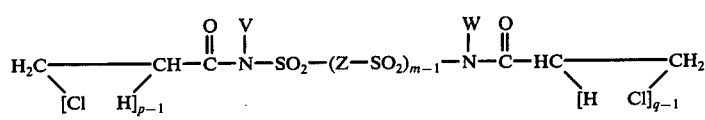

wherein V and W either each denote the same organic radical or each denote hydrogen atoms or one denotes an organic radical and the other denotes a hydrogen atom and p and q are 1 or 2, or are salts of those compounds wherein at least one of the symbols V and W denotes a hydrogen atom (German Offenlegungsschrift 2,309,098).

6. Compound of the formula

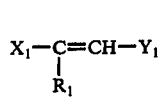

wherein $R_1$ denotes a hydrogen atom, an alkyl group, a cycloalkyl radical, an aralkyl radical, an aryl radical or a heterocyclic radical, $X_1$ denotes a heterocyclic radical which is bonded to the $-CR_1=CH-$ group via a ring nitrogen atom and $Y_1$ denotes an optionally functionally modified aldehyde group, and preferably compounds of the formula

34. $X_2-CH=CH-Y_2$ wherein $Y_2$ is an aldehyde group or aldehyde hydrate group and $X_2$ denotes a heterocyclic radical which is bonded to the $-CH=CH-$ group via a nitrogen atom of a five-membered heteroring containing 2 to 4 ring nitrogen atoms and 3 to 1 carbon atoms (U.S. Pat. No. 3,878,171).

7. Compounds of the formula

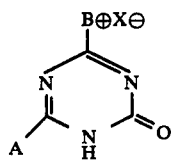

wherein A is hydrogen, hydroxyl, halogen, acylamino, an immonium-ether radical, the radical of the formula

wherein $R_1$ and $R_2$ independently of one another are hydrogen, optionally substituted alkyl, alkenyl, alkinyl, cycloalkyl having 5 or 6 carbon atoms, aryl or aralkyl or, conjointly with the nitrogen atom to which they are bonded, form a saturated ring which optionally contains yet further hetero-atoms, or the radical of the formula

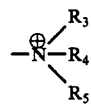

wherein $R_3$, $R_4$ and $R_5$ independently of one another are hydrogen, optionally substituted alkyl, alkenyl, alkinyl, cycloalkyl, aryl or aralkyl or, conjointly with the nitrogen atom to which they ae bonded, form a saturated or unsaturated ring which optionally contains yet further hetero-atoms, B+is an ammonium or phosphonium radical and X-is an anion, preferably a chloride, iodide, perchlorate, fluoborate, hexafluoroarsenate or hexafluorophosphate anion.

Preferred representatives of these compounds correspond, for example, to the formula

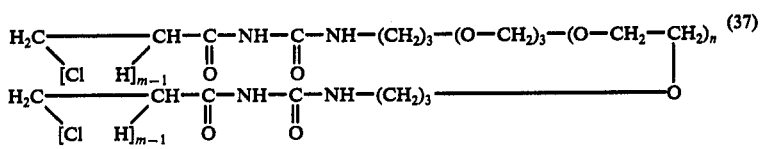

wherein $A_1$ is $NH_2$, methylamino, ethylamino, diethylamino, isopropylamino, hydroxyethylamino, methoxyethylamino, propeneamino, morpholino, anilino, furfurylamino, N-methylmorpholinium, N-ethylmorpholinium, N-methylpiperidinium, N-methylpyrolidinium, pyridinium, trimethylammonium, dimethylcyclohexylammonium, dimethylpropinylammonium or aza-(2,2,2)-bicyclooctano, $B_1$+is N-methylmorpholinium N-ethylmorpholinium, N-methylpiperidinium, N-methylpyrrolidinium, pyridinium, trimethylammonium, dimethylcyclohexylammonium, dimethylpropinylammonium are aza-(2,2,2)-bicyclooctano and $X_1$-is a chloride, iodide, perchlorate, fluoborate, hexafluoroarsenate or hexafluorophosphate anion (German Offenlegungsschrift No 2,410,973).

8. Compounds of the fomrula

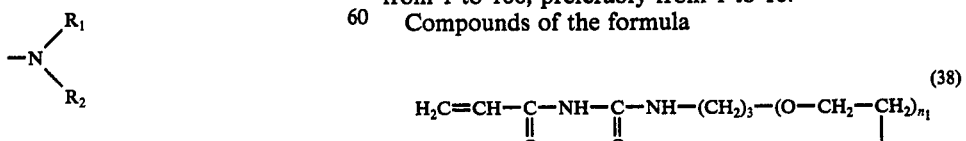

wherein m is 1 or 2 and n is an integer having a value from 1 to 100, preferably from 1 to 10.

Compounds of the formula $$H_2C=CH-\underset{O}{\underset{\|}{C}}-NH-\underset{O}{\underset{\|}{C}}-NH-(CH_2)_3-(O-CH_2-CH_2)_{n_1}$$
$$H_2C=CH-\underset{O}{\underset{\|}{C}}-NH-\underset{O}{\underset{\|}{C}}-NH-(CH_2)_3\text{————}O \quad (38)$$

wherein $n_1$ is an integer having a value from 1 to 10, preferably from 1 to 5, may be mentioned as examples. (German Offenlegungsschrift No. 2,421,506).

Compounds which are suitable for hardening maleic ahydride-copolymers are, in particular, polyhydric alcohols, such as, for example, glycerol, diethylene glycol, triethylene glycol, sorbitol and carbohydrates, organic diisocyanates and polyamines.

The exposed image can readily be fixed by washing off or by rubbing with a moist fibre material, the unexposed and thus unpolymerised parts being removed.

The colourless polymeric image can readily be developed to a coloured image by immersing the material with the fixed image into an aqueous or organic dye bath containing a dyestuff which is absorbed by the image substance or is fixed on the latter in some other way. It is, however, simpler already to incorporate the colouring substance in the coating solution. In that case, the colouring substance can be incorporated into the coating solution is a monomolecular or colloidal form or as a pigment.

Suitable layer carriers are, for example, plates of zinc, copper or aluminium, but preferably films of organic materials, such as, for example, of polyester, polyamide or cellulose acetate.

The carrier for the photographically sensitive monomer layer can be modified by suitable processes in such a way that optimum adhesion between the polymer formed and the carrier is achieved.

Suitable for this purpose are:

Subbing of the surface with hardened, originally watersoluble colloids (for example gelatine), additions of wetting agents to the coating solution, surface treatment of the carrier with wetting agents and surface modifications of the carrier by chemical reactions (for example sillations).

Under anaerobic conditions, the sensitivity of the recording material is 1 milliJoule/cm², and under aerobic conditions it is 5 milliJoule/cm². The recording material is produced by customary methods, for example by coating, spraying or dipping.

Moreover, the material suitable for photopolymerisation also offers the following advantages:

1. It is found that the material has a low sensitivity towards oxygen, as compared with other known materials. This can be due to the formation of diazine anion-radicals, preferably quinoxaline anion-radicals, which in their turn are strong reducing agents and consume the oxygen present.

2. The redox systems known hitherto have an adverse effect in many fields of photographic application due to the visible absorption chromophore of the required dyestuff (US-PS 3,097,096 and DT-OS No. 1,720,906).

These systems are sensitive to daylight, and a dark room is necessary for handling them. Frequently a complicated bleaching process which reduces the dyestuff used to its colourless leuco-form is carried out. The latter is, however, often rather unstable and re-oxidises slowly to the dyestuff (in this connection compare DT-OS No. 1,720,906).

The diazines have an electromagnetic absorption spectrum in the region from 200 to 450 nm and most of them are therefore colourless compounds; furthermore, the $S_o$-$S_1$ band lies within the range of the maximum UV emission of many mercury high-pressure copying lamps. As a consequence, bleaching of the diazine after photopolymerisation is not necessary. No additional reducing agents (phosphines, arsines, phosphinic acids and the like) are required in the system according to the invention for the formation of a redox pair, since the ethylenically unsaturated monomers, and the macromolecular binder if present, can conjointly with the diazines, form such a redox pair.

3. The use of this highly active initiator makes it possible to work with coloured monomer layers, that is to say, for example, yellow layers, magenta layers and cyan layers can be produced, without the sensitivity of the material being substantially impaired. The reason is the position of the absorption band of the diazine, which is capable of overlapping the minimum of the absorption band of the dyestuff.

4. The polymers, produced by means of the initiator system according to the present invention and optionally in the presence of the binders which are water-soluble or soluble in water-alcohol mixtures and may be colloidal, are distinguished by exceptionally favourable physical properties (adhesive strength on copper, aluminium, triacetate and polyester). The use of polymerisable monomers, and optionally binders, which are soluble in water or water-alcohol mixtures, permits the preparation of very thin layers (down to a minimum of about 1 $\mu$ layer thickness), without impairing the homogeneity and the sensitivity of the layers.

5. The material works in the absence of organic solvents or of acid or basic aqueous developer systems. Hence, it causes substantially less pollution than copying compositions which require organic solvents or acid or basic aqueous developers for processing (for example, DT-OS No. 2,039,861).

6. The polymers produced on a transparent substrate and dyed, possess excellent properties with regard to the reproduction of dots. Dot images on the photopolymer can be copied onto suitable substrates without the slightest loss in extent and density. This property is important in screen reproduction processes.

As a further object the present invention relates to a photopolymerisable material, suitable for the preparation of stable polymeric images, containing, on a carrier, at least one layer composed of at least one ethylenically unsaturated, photopolymerisable monomer and at least one photo-initiator, characterised in that the monomer is present in a matrix of a swellable reaction product from a chemically hardenable, non-light-sensitive, swellable macromolecular compound (binder) and a hardener, and optionally a macromolecular compound which is chemically inert towards the chemically hardenable compound and the hardener.

The invention also relates to a process for the manufacture of a photopolymerisable material, suitable for the preparation of stable polymeric images, characterised in that a solution containing a. at least one ethylenically unsaturated photopolymerisable monomer, b. a photo-initiator, c. a chemically hardenable, non-light-sensitive, swellable macromolecular compound and d. a hardener, and optionally e. a macromolecular compound which is chemically inert towards the components (c) and (d), is applied to a carrier as a layer and dried.

The invention also relates to the use of the photopolymerisable material in photopolymerisation processes for the purpose of recording information, in particular for the preparation of stable polymeric images. The recording of information, in particular the preparation of stable polymeric images, can be carried out, for example, by image-wise exposure of the material. Thereafter, the material is treated with a solvent which dissolves the components (a) and, optionally (b) but not the polymer formed from (a) by exposure and the hardened reaction product from (c) and (d) formed in the manufacture of the photopolymerisable material, and the solvent is then removed by drying.

Accordingly, the light-sensitive layer consists of a homogeneous phase containing monomers, the photo-initiator and swellable reaction products, the latter being formed by the reaction between the macromolecular compound (c) and the hardener (d), which has already gone almost to completion in the manufacture of the light-sensitive layer, and representing the matrix. During the development of the exposed layer only those fractions of the monomer which are not photopolymerised and, optionally, the photo-initiator are washed out by the solvent, whilst the matrix remains in existence on the entire surface of the layer. The polymeric image, formed after drying, which which can be carried out at temperatures from about 19° to 30° C, consists only of the matrix at the unexposed points, but at the exposed raised points it consists of the photopolymer embedded in the matrix. Due to this matrix present across the entire surface, a polymeric image with very good adhesion to the substrate and excellent mechanical strength is obtained.

Monomers (a) suitable for photopolymerisation are known from the literature. They can be bifunctional or polyfunctional, the polymers formed in the photopolymerisation accordingly being linearly or spatially crosslinked.

The polymerisable ethylenically unsaturated monomers (a), suitable for the process according to the invention, are soluble in water or in water-alcohol mixtures, preferably under neutral conditions, and contain one or more terminal double bonds.

Examples of monomers having a terminal double bond are acrylic acid and methacrylic acid, as well as the monovalent metal salts of the acids, for example the sodium salts and potassium salts; also unsubstituted or substituted amides of acrylic acid and methacrylic acid, such as for example, acrylamide, acrylic acid β-hydroxyethylamide, hydroxymethyldiacetoneacrylamide, diacetoneacrylamide and N-alkylamides having 1 to 8 carbon atoms in the alkyl part, such as for example, N-octylacrylamide; and furthermore N-vinylpyrrolidone, vinylsulphonic acid and sulphoacrylic acids. If appropriate, mixtures of different monomers can also be used.

Examples of monomers having several terminal double bonds are:

N,N'-alkylene-bis-acrylamides, bis-acrylamides, tris-acrylamides and divalent or trivalent metal salts of acrylic acid or methacrylic acid and also those of the formulae (2) to (7).

Suitable photo-initiators which, under the action of electromagnetic radiation, induce the photopolymerisation of the monomers are known from the literature. A summary can, for example, be found in G. Oster and N. L. Yang, Chem. Rev. 68, 125 (1968). The following compounds, for example, are particularly suitable: benzophenone, fluorenone, benzanthrone, benzoins and derivatives thereof and ketosulphides; organic sulphur compounds, such as aromatic disulphides.

aliphatic disulphides, S-acrylcarbamates and halosulphanes (compare, for example, U.S. Pat. No. 3,502,476);

azo compounds, such as alkylazo compounds, such as azo-bis(isobutyronitrile), β-azo-bis-1-cyclohexanecarbonitrile;

halogen-containing compounds, such as bromoform, and halogen-substituted styrenes, such as monobromostyrene or dibromostyrene;

metal carbonyls, such as $Mn_2(CO)_{10}$ and $Re_2(CO)_{10}$;

heterocyclic compounds, such as hexa-aryl-bis-imidazoles (see U.S. Pat. No. 3,390,994 or U.S. Pat. No. 3,579,342); and photo-redox-initiators, such as riboflavin, phenothiazine, phenazine dyestuffs, acridine dyestuffs or xanthene dyestuffs in the presence of mild reducing agents, such as tin chloride, ascorbic acid, glutathione, hydroxylamine, hydrazine, phenylhydrazine, allylthiourea (see, for example, U.S. Pat. No. 2,850,445 or U.S. Pat. No. 2,875,077), phosphines, arsines and sulphine compounds (DT-OS No. 1,720,906).

The photo-initiators can be employed in an amount from 0.01 to 5, preferably from 0.5 to 3, percent by weight, relative to the monomers to be polymerised.

Examples of suitable macromolecular compounds c), which can be hardened and swollen, are gelatine, modified gelatine, polyvinyl alcohol and optionally hydrolysed copolymers of olefines (for example ethylene or methyl vinyl ether) with maleic anhydride, such as are, for example, commerically obtainable under the names EMA and Lytron resins (Monsanto), Gantrez resins (GAF), PA resins (Gulf Oil) and SMA resins (Sinclair Petroleum Inc.).

Of course, mixtures of marcromolecular compounds which form homogeneous phases can also be used, provided at least one of the components is hardenable in the sense of the invention and the other (component e) can be regarded as chemically inert toward the hardener. A suitable mixture is obtained, for example, from poly-N-vinylpyrrolidone (component e) and gelatine or from polyacrylamides (component e) and gelatine.

Polyfunctional compounds which are employed as hardeners (d) in the binders of the type indicated are dealt with on pages 55 to 60 of the book by C.E.K. Mees and T.H. James "The Theory of the Photographic Process", 3rd edition. Examples of suitable hardeners are aldehydes, N-methylol compounds and also carbonic acid derivatives, such as, for example, polycarbonates, and sulphuric acid esters and sulphonyl halides, compounds which contain so-called "active halogen", such as, for example, α-chloroketones and α-bromoketones, epoxides, aziridines, active olefines, such as, for example, divinylsulphones, isocyanates, carbodiimides, and also specific acrylic acid compounds which are different from the polymerisable monomers of component (a) and triazine derivatives. Examples of suitable hardeners are those of the formulae (26) to (38).

Compounds which are suitable for hardening maleic anhydride copolymers are, in particular, polyhydric alcohols, such as, for example, glycerol, diethylene glycol, triethylene glycol, sorbitol and carbohydrates, organic diisocyanate and polyamines.

Substances, which can be used as the solvents containing the components (a) to (e), are those which are volatile under the conditions of dyeing and do not react chemically with any of the other components. Above all, water or watermiscible volatile solvents will be used, such as lower alcohols with 1 to 4 carbon atoms and also esters, ketones and other solvents which are miscible with water in all proportions, such as tetrahydrofurane or dimethylformamide. Solvents which are immiscible with water, or have only a limited miscibility, such as higher alcohols, esters and ketones, and also ethers or unsubstituted hydrocarbons, can also be used, provided the other components of the system permit this. Examples of solvents, other than water, which can be used are: methyl alcohol, ethyl alcohol, propyl or isopropyl alcohol, ethyl acetate, acetone, methyl ethyl ketone, methylcellosolve, tetrahydrofurane, dimethylformamide, butyl alcohol, amyl alcohol, cyclohexanol, benzyl alcohol, cyclohexanone, N-methylpyrrolidone, n-hexane, n-octane, chloroform, dichloroethane, benzene, monochlorobenzene or dichlorobenzene, toluene, xylene or mixtures of two or more of these compounds.

Preparation of the photo-initiators:

a. 1,2,3-Trimethyl-6- or -7-methoxyquinoxalinium methosulphate 3.6 g (0.02 mol) of 2,3-dimethyl-6-methoxyquinoxaline are dissolved in 12 ml of freshly distilled dimethyl sulphate and the solution is heated to 60° C for 3 hours in a stream of nitrogen. When the darkly coloured solution is cooled slowly, the desired product precipitates as yellow-brown crystals, which are filtered off, washed with dry acetone and then dried. Yield about 2.9 g, corresponding to 47% of theory; melting point: 178° C (decomposition). The IR (KBr) and NMR (D$_2$O) spectra show the bands to be expected from the structure.

b. 1,2,3-Trimethyl-6- or 7-methoxyquinoxalinium perchlorate 1.35 g (0.0043 mol) of 1,2,3-trimethyl-7-methoxyquinoxalinium methosulphate are dissolved in 5 ml of water. 1.7 g (0.0086 mol) of sodium perchlorate in 2 ml of water are added to the solution thus obtained, the desired perchlorate separating out immediately. To complete the reaction, stirring is continued for 15 minutes at room temperature. Thereafter, the precipitate is filtered off and washed with a little cold water. For purification, the crystals are taken up in 20 ml of water and treated hot with active charcoal. After cooling and drying, about 0.6 g (46% of theory) of brown-yellow crystals of melting point 193.1° C are thus obtained; their IR (KBr) and NMR (acetone-d$_6$) spectra are in agreement with the structure.

c. 1,2,3-Trimethyl-6,7-dimethoxyquinoxalinium iodide 5.5 g (0.025 mol) of 2,3-dimethyl-6,7-dimethoxyquinoxaline are dissolved in 30 ml of methyl iodide, in a 100 ml stirred autoclave. This solution is warmed to 100° C over the course of 24 hours. whilst stirring, the pressure rising to about 7 atmospheres gauge. After cooling to room temperature, the yellow precipitate is filtered off, rinsed with a little dry acetone and dried. Yield about 6.5 g, corresponding to 72% of theory. Melting point 210° to 212° C (decomposition). The IR (KBr) and NMR (DMSO-d$_6$) spectra are in agreement with the postulated structure.

The quinoxalinium salts listed in the table can be prepared analogously. The IR and NMR spectra of all the compounds show the absorption bands which are to be expected from their structure.

d. 2-Phenylquinoxaline-3'- and -4'-sulphonic acid 72 ml of chlorosulphonic acid are introduced into a reaction vessel provided with a stirrer, thermometer, condenser and a drying tube, and cooled to 0° C. 20 g of 2-phenylquinoxaline are added in portions, the temperature being maintained between 0° and 10° C. The mixture is then allowed to warm up to room temperature and is heated for 8 hours to 90° to 105° C. After cooling, the viscous mass is poured onto 300 g of ice and subsequently boiled under reflux until the entire precipitate has dissolved (hydrolysis of the sulphonic acid chloride). After cooling, the solution is extracted by shaking with benzene and is subsequently concentrated continuously. At first, 700 mg of pure 2-phenylquinoxaline-4'-sulphonic acid (NMR: all the aromatic protons on the benzene ring shown ortho-coupling and meta-coupling) are obtained and at the end, 1,000 mg of pure 2-phenyl-quinoxaline-3'-sulphonic acid (NMR: one aromatic proton on the benzene ring shows only meta-coupling) are obtained. In total, about 20 g of a mixture of 2-phenyl-quinoxaline-3'-sulphonic acid and 2-phenylquinoxaline-4'-sulphonic acid are obtained; the mixture has a melting point above 270° C.

e. 2-p-Methoxyphenyl-6'- and 7'-sulphoquinoxaline 1. 109 g of 3-amino-4-nitro-benzenesulphonic acid, 680 g of tin-(II) chloride and 1.8 l of concentrated hydrochloric acid are added together, whilst stirring, in a reaction vessel (2.5 l capacity) provided with a stirrer, thermometer and condenser, the temperature rising to about 60° C. The reaction mixture is stirred at 80° C for 2 hours, then cooled to 0° C and filtered. The residue is dissolved in 1 l of hot water and the solution is treated with active charcoal for 10 minutes and filtered again. On cooling, 3,4-diaminobenzenesulphonic acid crystallises from the solution and is separated off and converted into the sodium salt by means of a 30% strength aqueous sodium hydroxide solution. The salt is precipitated and separated off by adding ethanol to the aqueous solution.

2. 110 g of bromine dissolved in 100 ml of chloroform are added dropwise to 50 g of p-methoxyacetophenone dissolved in 350 ml of chloroform, in a reaction vessel (1 l capacity) provided with a condenser, dropping funnel and stirrer. After completion of the addition, stirring is continued for a further ½ hour. Thereafter, the reaction mixture is poured onto 400 ml of ice-water. The chloroform phase is washed with twice 50 ml of saturated sodium bicarbonate solution and twice 50 ml of saturated sodium bisulphite solution, then dried over magnesium sulphate and evaporated to dryness. The residue is taken up in methanol, treated with active charcoal and finally recrystallised from methanol. Yield: 813 g (80% of theory).

NMR spectrum: 6.75 ppm —C$\underline{\text{H}}$Br$_2$ (in CDCl$_3$) 3.93 ppm —OC$\underline{\text{H}}_3$ (in CDCl$_3$)

3. 32.82 g of 3,4-diaminobenzenesulphonic acid (Na salt), 22.63 g of sodium acetate (dried) and 44.34 g of 2,2-dibromo-p-methoxyacetophenone are successively introduced into a 2 l reaction flask provided with a stirrer and a reflux condenser. 1 l of methanol (anhydrous) is then added and the reaction mixture is heated at the reflux temperature for 3 days. After cooling the reaction mixture, the product which has precipitated is filtered off and washed with twice 50 ml of cold methanol. The product is then taken up in 250 ml of methanol and the mixture is warmed for 1 hour on a water bath. The reaction product is then filtered off hot and dried. Yield: 29.5 g (60.6% of theory) of 2-p-methoxyphenyl-6'- and -7'-sulphoquinoxaline. In stage 3, p-methoxyphenylglyoxal can also be employed in place of 2,2-dibromo-p-methoxyacetophenone, and good yields are likewise obtained.

f. Sodium salt of 2- and 3-phenyl-6-sulphoquinoxaline 15.1 g of the sodium salt of 3,4-diaminobenzenesulphonic acid are dissolved in 450 ml of methanol and 2 ml of acetic acid (concentrated). 10.6 g of phenylglyoxal hydrate dissolved in 70 ml of methanol are slowly added to the solution cooled to 10° C. After 45 minutes at the boil, the reaction mixture is cooled to 0° C. The product which has precipitated is filtered off. Further reaction product is isolated from the filtrate by slowly distilling off the solvent. Yield: 17.7 g (87% of theory), relative to the sodium salt of 3,4-diaminobenzenesulphonic acid.

The nuclear magnetic resonance spectrum in dimethylsulphoxide (DMSO-d$_6$) shows that the ratio of isomers is 1:3. Proton at C$_2$: 9.68 ppm (in DMSO-d$_6$) Proton at C$_3$: 9.65 ppm (in DMSO-d$_6$).

The quinoxalines and quinoxalinium salts, which can be used for the present process, in the table which follows correspond to the formula

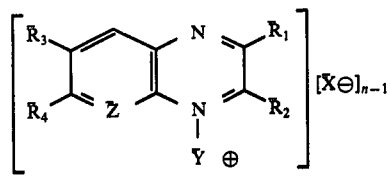

(39)

-continued

Z denotes $\overset{\diagdown}{\underset{R_5}{\overset{\diagup}{C}}}$ (No. 101 to 246)

or $\overset{\diagdown}{\underset{}{\overset{\diagup}{N}}}$ (No. 247 to 251)

"d" denotes decomposition,
* denotes "hydrobromide" and
** denotes an oil which partly solidifies on standing.

Only one of the two isomeric forms of each of the quinoxalinium salts is indicated. No investigation was carried out as to whether the compound is present in the configuration indicated or in the configuration isomeric thereto.

| No. | R$_1$ | R$_2$ | R$_3$ | R$_4$ | R$_5$ | Y | n | X | Melting Point °C | |
|---|---|---|---|---|---|---|---|---|---|---|
| 101 | C$_6$H$_5$ | CH$_3$ | CH$_3$O | CH$_3$O | H | CH$_3$ | 2 | CH$_3$SO$_4$ | 205-8 | d |
| 102 | CH$_3$ | C$_6$H$_5$ | H | CH$_3$O | H | CH$_3$ | 2 | ClO$_4$ | 123-8 | d |
| 103 | C$_6$H$_5$ | C$_6$H$_5$ | H | C$_6$H$_5$—CH$_2$—O | H | CH$_3$ | 2 | ClO$_4$ | 120 | d |
| 104 | CH$_3$ | CH$_3$ | CH$_3$O | CH$_3$O | —NO$_2$ | CH$_3$ | 2 | CH$_3$SO$_4$ | 218-22 | d |
| 105 | C$_6$H$_5$ | C$_6$H$_5$ | O—CH$_2$—CH$_2$—O | | H | CH$_3$ | 2 | ClO$_4$ | 145 | d |
| 106 | C$_6$H$_5$ | C$_6$H$_5$ | H | CH$_3$O | H | CH$_3$ | 2 | CH$_3$SO$_4$ | 218 | d |
| 107 | C$_6$H$_5$ | C$_6$H$_5$ | H | CH$_3$O | H | CH$_3$ | 2 | ClO$_4$ | 224.8 | |
| 108 | CH$_3$ | CH$_3$ | CH$_3$O | CH$_3$O | H | CH$_3$ | 2 | I | 210-2 | d |
| 109 | 4-CH$_3$O—C$_6$H$_4$— | 4-CH$_3$O—C$_6$H$_4$ | H | H | H | CH$_3$ | 2 | CH$_3$SO$_4$ | 140 | d |
| 110 | CH$_3$ | CH$_3$ | H | CH$_3$O | H | CH$_3$ | 2 | CH$_3$SO$_4$ | 178 | |
| 111 | CH$_3$ | CH$_3$ | H | CH$_3$O | H | CH$_3$ | 2 | ClO$_4$ | 193.1 | |
| 112 | C$_6$H$_5$ | C$_6$H$_5$ | CH$_3$O | CH$_3$O | H | CH$_3$ | 2 | CH$_3$SO$_4$ | 190-4 | d |
| 113 | C$_6$H$_5$ | C$_6$H$_5$ | CH$_3$O | CH$_3$O | H | CH$_3$ | 2 | ClO$_4$ | 240.9 | |
| 114 | CH$_3$ | CH$_3$ | H | C$_2$H$_5$O | H | CH$_3$ | 2 | CH$_3$SO$_4$ | 149-52 | d |
| 115 | CH$_3$ | CH$_3$ | CH$_3$O | CH$_3$O | H | CH$_3$ | 2 | CH$_3$SO$_4$ | 85-95 | d |
| 116 | CH$_3$ | CH$_3$ | CH$_3$O | CH$_3$O | H | CH$_3$ | 2 | ClO$_4$ | 263 | |
| 117 | C$_6$H$_5$ | C$_6$H$_5$ | H | C$_2$H$_5$O | H | CH$_3$ | 2 | CH$_3$SO$_4$ | 164-74 | d |
| 118 | C$_6$H$_5$ | C$_6$H$_5$ | H | H | —OCH$_3$ | CH$_3$ | 2 | ClO$_4$ | 236-9 | d |
| 119 | CH$_3$ | CH$_3$ | O—CH$_2$—O | | H | CH$_3$ | 2 | CH$_3$SO$_4$ | 196 | |
| 120 | C$_6$H$_5$ | C$_6$H$_5$ | O—CH$_2$—O | | H | CH$_3$ | 2 | ClO$_4$ | 252 | |
| 121 | C$_6$H$_5$ | C$_6$H$_5$ | O—CH$_2$—CH$_2$—O | | H | CH$_3$ | 2 | CH$_3$SO$_4$ | 212-6 | d |
| 122 | C$_6$H$_5$ | C$_6$H$_5$ | H | HC=N—C(H)=CH | | CH$_3$ | 2 | CH$_3$SO$_4$ | 213-7 | |
| 123 | CH$_3$ | CH$_3$ | H | H | H | — | 1 | — | 106.5 | d |
| 124 | CH$_3$ | CH$_3$ | H | H | H | CH$_3$ | 2 | ClO$_4$ | 199 | |
| 125 | C$_6$H$_5$—CO | C$_6$H$_5$—CO | H | H | H | — | 1 | — | 171 | d |
| 126 | C$_6$H$_5$—CO | H | H | H | H | — | 1 | — | 79.7 | |
| 127 | C$_6$H$_5$ | C$_6$H$_5$ | H | H | OCH$_3$ | — | 1 | — | 192.2 | |
| 128 | CH$_3$ | CH$_3$ | H | H | OCH$_3$ | — | 1 | — | 121.6 | |
| 129 | CH$_3$ | CH$_3$ | H | CN | H | — | 1 | — | 205.9 | |
| 130 | CH$_3$ | CH$_3$ | CH$_3$O | CH$_3$—C(=N)—C(H)=C(H) | | — | 1 | — | 109.4 | |
| 131 | CH$_3$ | CH$_3$ | O—CH$_2$—O | | H | — | 1 | — | 213.4 | |
| 132 | C$_6$H$_5$ | C$_6$H$_5$ | H | —NO$_2$ | H | — | 1 | — | 187.1 | |
| 133 | CH$_3$ | CH$_3$ | H | —N$^{\oplus}$(CH$_3$)$_3$ | H | — | 1 | I | 180-8 | d |
| 134 | CH$_3$ | CH$_3$ | H | HO$_3$S | H | — | 1 | — | 300 | |
| 135 | C$_6$H$_5$—CO | C$_6$H$_5$—CO | H | H | H | — | 1 | — | 171.3 | |
| 136 | CH$_3$ | CH$_3$ | CH$_3$O | CH$_3$O | NO$_2$ | — | 1 | — | 177.2 | |
| 137 | CH$_3$ | CH$_3$ | H | C$_2$H$_5$—O | H | — | 1 | — | 108.9 | |
| 138 | C$_6$H$_5$ | C$_6$H$_5$ | H | CH$_3$ | H | CH$_3$ | 2 | ClO$_4$ | 250.8 | |
| 139 | CH$_3$ | CH$_3$ | H | NH$_2$ | H | — | 1 | — | 191.9 | |
| 140 | C$_6$H$_5$ | CH$_3$ | CH$_3$O | CH$_3$O | H | — | 1 | — | 150.5 | |
| 141 | —CH$_2$OH | —CH$_2$OH | O—CH$_2$—CH$_2$—O | | H | — | 1 | — | 180.8 | |
| 142 | —CH$_2$OH | —CH$_2$OH | CH$_3$O | CH$_3$O | H | — | 1 | — | 183.7 | |
| 143 | CH$_2$OH | CH$_2$OH | O—CH$_2$—O | | H | — | 1 | — | 198.5 | |
| 144 | C$_6$H$_5$ | C$_6$H$_5$ | H | H | H | CH$_3$ | 2 | ClO$_4$ | 145.7 | |
| 145 | CH$_3$ | CH$_3$ | H | CH$_3$ | H | CH$_3$ | 2 | ClO$_4$ | 194 | |

-continued

| # | | | | | | | | | |
|---|---|---|---|---|---|---|---|---|---|
| 146 | C₆H₅ | C₆H₅ | H | Cl | H | CH₃ | 2 | ClO₄ | 209.3 |
| 147 | C₆H₅ | C₆H₅ | H | CN | H | — | 1 | — | 181.4 |
| 148 | CH₃ | CH₃ | H | CON(C₂H₅) | H | — | 1 | — | 73.3 |
| 149 | C₆H₅ | C₆H₅ | H | CON(C₂H₅) | H | — | 1 | — | 137.0 |
| 150 | CH₃ | CH₃ | NH₂ | CH₃O | H | — | 1 | — | 252 |
| 151 | CH₃ | CH₃ | H | CO—OC₂H₅ | H | — | 1 | — | 100.6 |
| 152 | C₆H₅ | C₆H₅ | H | CO—OC₂H₅ | H | — | 1 | — | 151.9 |
| 153 | CH₃ | CH₃ | H | CH₃O | NHCO—CH₃ | — | 1 | — | 183.9 |
| 154 | C₆H₅ | C₆H₅ | CH₃O | CH₃O | H | — | 1 | — | 252.4 |
| 155 | CH₃ | CH₃ | CH₃O | CH₃O | H | — | 1 | — | 178.1 |
| 156 | C₆H₅ | C₆H₅ | H | CH₃O | Cl | — | 1 | — | 186.4 |
| 157 | CH₃ | CH₃ | H | CH₃O | Cl | — | 1 | — | 147.3 |
| 158 | C₆H₅ | C₆H₅ | H | Cl | OCH₃ | — | 1 | — | 140.0 |
| 159 | C₆H₅ | C₆H₅ | H | CO—OCH₃ | H | — | 1 | — | 290.3 |
| 160 | C₆H₅ | C₆H₅ | H | CO—OCH₃ | H | — | 1 | — | 290.3 |
| 161 | CH₃ | CH₃ | H | CO—OCH₃ | H | — | 1 | — | 262.6 |
| 162 | C₆H₅ | C₆H₅ | H | C₂H₅O | H | — | 1 | — | 154.3 |
| 163 | C₆H₅ | CH₃ | H | CH₃O | H | — | 1 | — | 88.6 |
| 164 | CH₃ | C₆H₅ | H | CH₃O | H | — | 1 | — | 122.0 |
| 165 | C₆H₅ | C₆H₅ | H | CH₃O | H | — | 1 | — | 160.8 |
| 166 | CH₃ | CH₃ | H | CH₃O | H | — | 1 | — | 100.3 |
| 167 | C₆H₅ | C₆H₅ | H | C₄H₉O | H | — | 1 | — | 144.0 |
| 168 | CH₃ | CH₃ | H | CH₃O | NHC=O—C₆H₅ | — | 1 | — | 196.3 |
| 169 | CH₃ | CH₃ | H | CONH₂ | H | — | 1 | — | 250 |
| 170 | C₆H₅ | C₆H₅ | H | COOCH₃ | H | — | 1 | — | 145.2 |
| 171 | C₆H₅ | C₆H₅ | H | CONH₂ | H | — | 1 | — | 254.2 |
| 172 | CH₃ | CH₃ | H | Cl | OCH₃ | — | 1 | — | 50.4 |
| 173 | CH₃ | CH₃ | H | C₄H₉O | H | — | 1 | — | 50.4 |
| 174 | CH₃ | CH₃ | H | CH₃O | NO₂ | — | 1 | — | 150.1 |
| 175 | CH₃ | CH₃ | H | C₂H₅O | NO₂ | — | 1 | — | 144.2 |
| 176 | CH₃ | CH₃ | H | CH₃O | NH₂ | — | 1 | — | 135.7 |
| 177 | CH₃ | CH₃ | O—CH₂—O | | H | — | 1 | — | 213.3 |
| 178 | CH₃ | C₆H₅ | O—CH₂—O | | H | — | 1 | — | 125.2 |
| 179 | CH₃ | CH₃ | H | O—CH₂—O | | — | 1 | — | 154.5 |
| 180 | CH₃ | CH₃ | H | O—CH₂—CH₂—O | | — | 1 | — | 141.3 |
| 181 | C₆H₅ | C₆H₅ | O—CH₂—CH₂—O | | H | — | 1 | — | 225.0 |
| 182 | C₆H₅ | C₆H₅ | O—CH₂—O | | H | — | 1 | — | 152.7 |
| 183 | C₆H₅ | C₆H₅ | H | O—CH₂—O | | — | 1 | — | 136.9 |
| 184 | CH₃ | CH₃ | O—CH₂—CH₂—O | | H | — | 1 | — | 189.9 |
| 185 | CH₃ | C₆H₅ | O—CH₂—CH₂—O | | H | — | 1 | — | 105.6 |
| 186 | C₆H₅ | C₆H₅ | H | O—CH₂—CH₂—O | | — | 1 | — | 192.2 |
| 187 | CH₂Br | CH₂Br | CH₃O | CH₃O | H | — | 1 | — | 185.6 |
| 188 | CH₂—OH | CH₂—OH | CH₃O | CH₃O | H | — | 1 | — | 121.5 |
| 189 | CH₂OH | CH₂OH | CH₃O | CH₃O | H | — | 1 | — | 183.7 |

Boiling point at 0.08 mm Hg:

| # | | | | | | | | | | |
|---|---|---|---|---|---|---|---|---|---|---|
| 190 | CH₂OCH₃ | CH₂OCH₃ | H | H | H | — | 1 | — | 103–5 | |
| 191 | CH₂—N(CH₃)₂ | CH₂N(CH₃)₂ | CH₃CONH | CH₃O— | H | — | 1 | — | 198–9 | d |
| 192 | CH₂—SCH₃ | CH₂SCH₃ | H | Cl | H | — | 1 | — | 122.8 | |
| 193 | CH₂Br | CH₂Br | CH₃CONH | CH₃O | H | — | 1 | — | 214–5 | |
| 194 | CH₂—O—CO—CH₃ | CH₂—O—CO—CH₃ | O—CH₂—O | | H | — | 1 | — | 138.7 | |
| 195 | CH₂Br | CH₂Br | O—CH₂—CH₂—O | | H | — | 1 | — | 180–90 | d |
| 196 | CH₂—OCOCH₃ | CH₂—OCOCH₃ | O—CH₂—CH₂—O | | H | — | 1 | — | 187 | d |
| 197 | CH₂Br | CH₂Br | O—CH₂—OH | | H | — | 1 | — | 187.5 | |
| 198 | CH₂—OCOCH₃ | CH₂—OCOCH₃ | H | H | H | — | 1 | — | 85.1 | |
| 199 | CH₂Br | CH₂Br | H | Cl | H | — | 1 | — | 143.3 | |
| 200 | CH₂Br | CH₂Br | H | CH₃O | Cl | — | 1 | — | 165.7 | |
| 201 | CH₂Br | CH₂Br | H | Cl | CH₃O | — | 1 | — | 93.6 | |
| 202 | CH₂Br | CH₂Br | H | H | CH₃O | — | 1 | — | 155.6 | |
| 203 | CH₂Br | CH₂Br | H | H | H | — | 1 | — | 155.0 | |
| 204 | CH₂Br | CH₂Br | H | COOC₂H₅ | H | — | 1 | — | 85.0 | |
| 206 | CH₂—OCOCH₃ | CH₂—OCOCH₃ | H | COOC₂H₅ | H | — | 1 | — | 94.3 | |
| 207 | CH₂—OCOCH₃ | CH₂—OCOCH₃ | H | CH₃O | H | — | 1 | — | 71.8 | |
| 208 | CH₂—OCOCH₃ | CH₂—OCOCH₃ | H | H | CH₃O | — | 1 | — | 80.3 | |
| 209 | CH₂OH | CH₂OH | H | H | H | — | 1 | — | 162.6 | |
| 210 | CH₂OH | CH₂OH | H | COOK | H | — | 1 | — | >300 | |
| 211 | CH₂OH | CH₂OH | H | CH₃O | H | — | 1 | — | xx) | |
| 212 | CH₂Br | CH₂Br | H | NO₂ | H | — | 1 | — | 114.5 | |
| 213 | CH₂OH | CH₂OH | O—CH₂—CH₂—O | | H | — | 1 | — | 180.8 | |
| 214 | CH₂—OCOCH₃ | CH₂—OCOCH₃ | H | NO₂ | H | — | 1 | — | 122.8 | |
| 215 | CH₂—OCOCH₃ | CH₂—OCOCH₃ | H | CH₃O | Cl | — | 1 | — | 107.3 | |
| 216 | CH₂—OCOCH₃ | CH₂—OCOCH₃ | H | Cl | CH₃O | — | 1 | — | 99.6 | |
| 217 | CH₂OH | CH₂OH | H | CH₃O | Cl | — | 1 | — | 179.3 | |
| 218 | CH₂OH | CH₂OH | H | Cl | CH₃O | — | 1 | — | 112.6 | |
| 219 | CH₂—S—C(=NH)NH₂ | CH₂—S—C(=NH)NH₂ | O—CH₂—CH₂—O | | H | — | 1 | — | x) | |
| 220 | CH₂—S—C(=NH)NH₂ | CH₂—S—C(=NH)NH₂ | H | H | H | — | 1 | — | x) | |
| 221 | CH₂—SC₄H₉ | CH₂—SC₄H₉ | H | H | H | — | 1 | — | 55.8 | |
| 222 | H₃C, CH₃, CH₂—S—C—S—CH₂ | | H | H | H | — | 1 | — | 195.5 | |

-continued

| No. | $R_1$ | $R_2$ | $R_3$ | $R_4$ | $Z$ | $Y$ | $n$ | $X$ | Melting point in °C | |
|---|---|---|---|---|---|---|---|---|---|---|
| 223 | CH$_2$—SCOCH$_3$ | CH$_2$—SCOCH$_3$ | H | H | H | — | 1 | — | 105.9 | |
| 224 | CH$_2$Cl | CH$_2$Cl | H | H | H | — | 1 | — | 148.8 | |
| 225 | CH$_2$Cl | CH$_2$Cl | H | H | CH$_3$ | — | 1 | — | 110.3 | |
| 226 | CH$_2$Br | CH$_2$Br | H | C$_4$H$_9$ | H | — | 1 | — | xx) | |
| 227 | CH$_2$—OCOCH$_3$ | CH$_2$—OCOCH$_3$ | H | C$_4$H$_9$ | H | — | 1 | — | xx) | |
| 228 | CH$_2$OH | CH$_2$OH | H | C$_4$H$_9$ | H | — | 1 | — | xx) | |
| 229 | CH$_2$OH | CH$_2$OH | NH$_2$ | CH$_3$O | H | — | 1 | — | 158 | |
| 230 | CH$_2$Cl | CH$_2$Cl | H | HO | H | — | 1 | — | 172–174 | d |
| 231 | CH$_2$OH | CH$_2$OH | NH–COCH$_3$ | CH$_3$O | H | — | 1 | — | 236.3 | |
| 232 | CH$_2$—OCOCH$_3$ | CH$_2$—OCOCH$_3$ | NH–COCH$_3$ | CH$_3$O | H | — | 1 | — | 158.0 | |
| 233 | —CH$_2$—C(NC)(COOC$_2$H$_5$)—CH— | | H | H | H | — | 1 | — | 146.3 | |
| 234 | CH$_3$ | CH$_3$ | H | CH$_3$—O | H | CH$_3$ | 2 | PF$_6$ | 149–152 | d |
| 235 | C$_6$H$_5$ | C$_6$H$_5$ | H | H | H | CH$_3$ | 2 | PF$_6$ | 124–129 | d |
| 236 | C$_6$H$_5$ | C$_6$H$_5$ | H | CH$_3$ | H | CH$_3$ | 2 | PF$_6$ | 214–218 | d |
| 237 | C$_6$H$_5$ | C$_6$H$_5$ | H | CH$_3$ | H | CH$_3$ | 2 | BF$_4$ | 238–239 | d |
| 238 | C$_6$H$_5$ | C$_6$H$_5$ | H | CH$_3$ | H | CH$_3$ | 2 | AsF$_6$ | 223–229 | d |
| 239 | C$_6$H$_5$ | C$_6$H$_5$ | H | CH$_3$—O | H | CH$_3$ | 2 | PF$_6$ | 213–216 | |
| 240 | C$_6$H$_5$ | C$_6$H$_5$ | H | CH$_3$—O | H | CH$_3$ | 2 | BF$_4$ | 208–209 | |
| 241 | C$_6$H$_5$ | C$_6$H$_5$ | H | CH$_3$—O | H | CH$_3$ | 2 | AsF$_6$ | 215–217 | |
| 242 | C$_6$H$_5$ | C$_6$H$_5$ | H | CH$_3$—O | H | CH$_3$ | 2 | Cl | 174 | d |
| 243 | C$_6$H$_5$ | C$_6$H$_5$ | H | Cl | H | CH$_3$ | 2 | PF$_6$ | 209–212 | d |
| 244 | C$_6$H$_5$ | C$_6$H$_5$ | CH$_3$O | CH$_3$—O | H | CH$_3$ | 2 | Cl | 205–209 | d |
| 245 | C$_6$H$_5$ | C$_6$H$_5$ | H | CH$_3$ | H | CH$_3$ | 2 | Cl | 224 | d |

| No. | $R_1$ | $R_2$ | $R_3$ | $R_4$ | $Z$ | $Y$ | $n$ | $X$ | Melting point in °C | |
|---|---|---|---|---|---|---|---|---|---|---|
| 246 | CH$_2$—O—COCH$_3$ | CH$_2$—O—COCH$_3$ | O—CH$_2$—O | | | CH$_3$ | 2 | FSO$_3$ | 135–145 | d |
| 247 | CH$_3$ | CH$_3$ | Br | H | N | — | 1 | — | 141,7 | |
| 248 | C$_6$H$_5$ | C$_6$H$_5$ | Br | H | N | — | 1 | — | 126–129 | |
| 249 | C$_6$H$_5$ | C$_6$H$_5$ | H | H | N | — | 1 | — | 143,4 | |
| 250 | CH$_3$ | CH$_3$ | H | H | N | — | 1 | — | 144,4 | |
| 251 | CH$_3$ | CH$_3$ | H | OH | N | — | 1 | — | 203,6 | |

EXAMPLE 1

Cellulose triacetate films covered with hardened gelatine are coated with the coating solutions A and B and contain, per m², the following quantities of substance:

| from coating solution | A [g/m²] | B [g/m²] |
|---|---|---|
| Gelatine | 7.68 | 7.68 |
| Hardener | 0.081 | 0.081 |
| (Compound of the formula (301) | | |

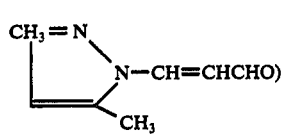

| | | |
|---|---|---|
| N-methylperfluoroalkylsulphonamide, etherified with polyethylene glycol (wetting agent) | 0.107 | 0.107 |
| Calcium bis-acrylate | 26.07 | 26.07 |
| Acrylamide | 3.89 | 3.89 |
| Glycerol | 2.14 | 2.14 |
| Photo-initiator (compound of the formula (302) | | |

-continued

| from coating solution | A [g/m²] | B [g/m²] |
|---|---|---|
| | 1.03 | 0.53 |

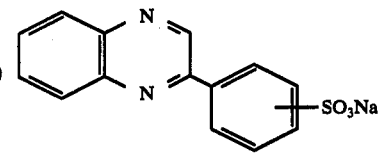

The coated film is then dried at about 30° C.

The film thus treated is exposed under a photographic step wedge (12 steps) for 30 seconds by the contact process using a 400 Watt mercury high pressure lamp at a distance of 40 cm. The film is then washed with water or rubbed with moist cottonwool and thereafter dyed by immersion for 10 seconds into a 2% strength aqueous solution of the dyestuff of the formula

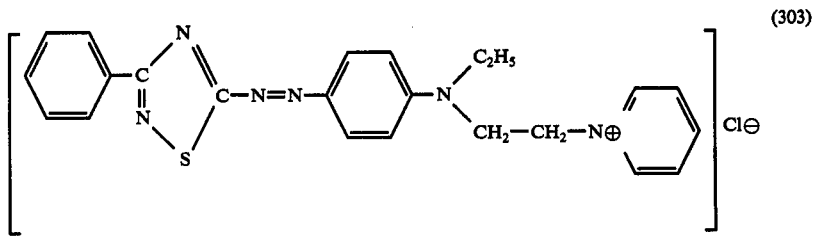

(303)

The film strip is then washed with water for 2 to 3 seconds and dried. All 12 wedge steps are clearly recognisable. The maximum colour density is about 3.2.

The absolute sensitivity S [Joule cm$^{-2}$] at an optical density of 1 is determined, and the following results are obtained:

| A | B |
|---|---|
| $8.2 \cdot 10^{-3}$ | $5.7 \cdot 10^3$ |

S is determined by means of an absolute D/log E curve. The exposure is carried out with monochromatic light at a wavelength of 366 nm and an intensity of $1.1 \cdot 10^{-9}$ Einstein cm$^{-2}$sec$^{-1}$. The after-treatment (development) of the exposed material is carried out as described. The optical density is based on that of the dyestuff at the absorption maximum (500 nm).

Similarly good results can be achieved if one of the following diazine compounds is employed: No. 108, 110, 111, 123, 126, 127, 128, 130, 131, 132, 133, 134, 136, 137, 138, 139, 140, 143, 188, a mixture of 2-phenylquinoxaline-3'- and -4'-sulphonic acids (see Preparation Instruction (d)), 2-phenylquinoxaline-6- or -7-sulphonic acid, 2,3-dimethyl-5,8-dimethoxyquinoxaline or 2,3-dimethyl-5,8-dihydroxyquinoxaline.

Barium bis-acrylate or strontium bis-acrylate can also be used in the coating solutions A and B in place of calcium bis-acrylate.

EXAMPLE 2

A cellulose triacetate (or polyester) film covered with hardened gelatine is coated with 60 ml/m$^2$ of the following coating solution.

a.
14.3 ml of 1.68 molar aqueous calcium bis-acrylate solution
6.47 g of acrylamide,
42 ml of 15% strength aqueous gelatine,
200 mg of glycerol or polyoxyethylene sorbitol,
2 ml of a 10% strength solution of N-methylolperfluoroalkylsulphonamide, etherified with polyethylene glycol (wetting agent),
200 mg of the compound of the formula

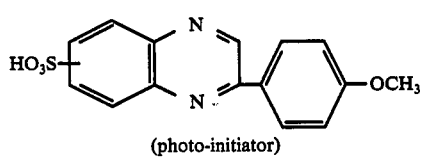

(photo-initiator) (304)

and 190 mg of the compound of the formula

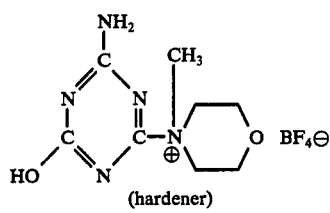

(hardener) (305)

made up to 200 ml with water;

b. As coating solution (a), but with 240 mg of the compound of the formula

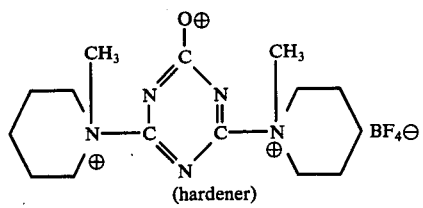

(hardener) (306)

c. As coating solution (a), but with 389 mg of the compound of the formula

(hardener) (307)

d. As coating solution (a), but with 200 mg of the compound of the formula

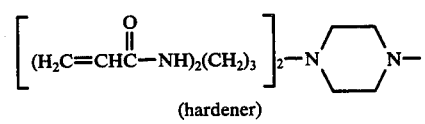

(hardener) (308)

e. As coating solution (a), but with 100 mg of dichlorohydroxy-s-triazine (sodium salt) (hardener), f. As coating solution (a), but with 280 mg of the photoinitiator, g. As coating solution (a), but with an additional 34 ml of a 10% strength chromium alum solution, h. As coating solution (a), but with 10 g of sodium vinylsulphonate in place of acrylamide, or i. As coating solution (a), but with 1 g of sulphoethyl acrylate in place of acrylamide.

k. Comparative example: As coating solution (a), but without hardener.

l. Comparative example (Example 10 from U.S. Pat. No. 3,097,096)
A solution of:
20 g of acrylamide,
0.2 g of N,N'-methylene-bis-acrylamide,
0.05 g of riboflavin,
5 g of gelatine and
0.1 g of crystal violet,
made up to 100 ml with water.

The solution is coated in accordance with 1a) onto a triacetate film, dried and subjected to photo-polymerisation.

The films coated with these coating solutions are then dried at temperatures of about 30° C. The layer thickness is about 3.5 $\mu$.

The film thus treated is exposed under a photographic step wedge (12 steps) for 30 seconds by the contact process using a 400 Watt mercury high-pressure lamp at a distance of 40 cm. The film is then washed with water (fixed) and then dyed with a 2% strength aqueous solution of the dyestuff of the formula

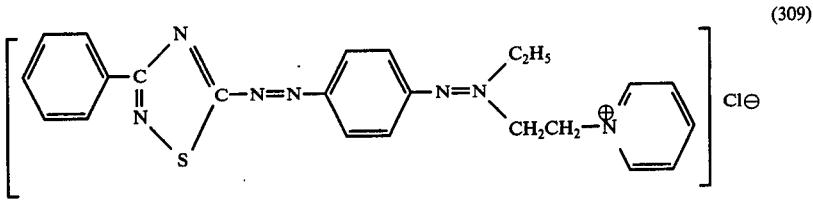
(309)

Thereafter the film is washed with water for 2 to 3 seconds and dried. All 12 wedge steps are clearly visible. The fixing, dyeing and washing out can be carried out in a customary roller processor.

The followin data are obtained (a) – (g):

| Films treated with | Exposure time | Maximum colour density at 500 nm | Absolute sensitivity S [in mJoule/cm OD = 1] |
|---|---|---|---|

| | | | |
|---|---|---|---|
| a,b,c,d,e,f[1], g,h,i | 3 seconds | 2.28 | |
| a,b,c,d,e,f, g,h,i, | 5 seconds | 3.20 | |
| a,b,c,d,e,f, g,h,i | 10 seconds | 3.52 | 1 mJ/cm² |
| a,b,c,d,e,f, g,h,i | 15 seconds | 3.84 | |
| a,b,c,d,e,f, g,h,i | 20 seconds | 3.84 | |

The absolute sensitivity S is measured at a wavelength of 366 nm and a light intensity of $1.1 \cdot 10^{-9}$ Einstein $cm^{-2}sec^{-1}$. 1) The absolute sensitivity for f) is $8 \cdot 10^{-4}$ J/cm².

The polymeric images on the films which were coated with the coating solutions (a) to (i) are, in the wet state, resistant to abrasion.

In the case of the film which was coated with coating solution k), on the other hand, the applied layer has only an inadequate strength. Even the contact with water necessary for developing is sufficient to dissolve the layer, so that it is not possible to prepare stable polymeric images. On developing (dissolving out the unpolymerised parts and the binder) with water, the film treated with the coating solution 1) shows a relief fro a short time, but the relief is very easily stripped from the carrier and has no mechanical strength. The relief is unsuitable for further treatment or further processing. The following cationic dyestuffs can be used for the preparation of negative reproductions with the relief images according to the invention:

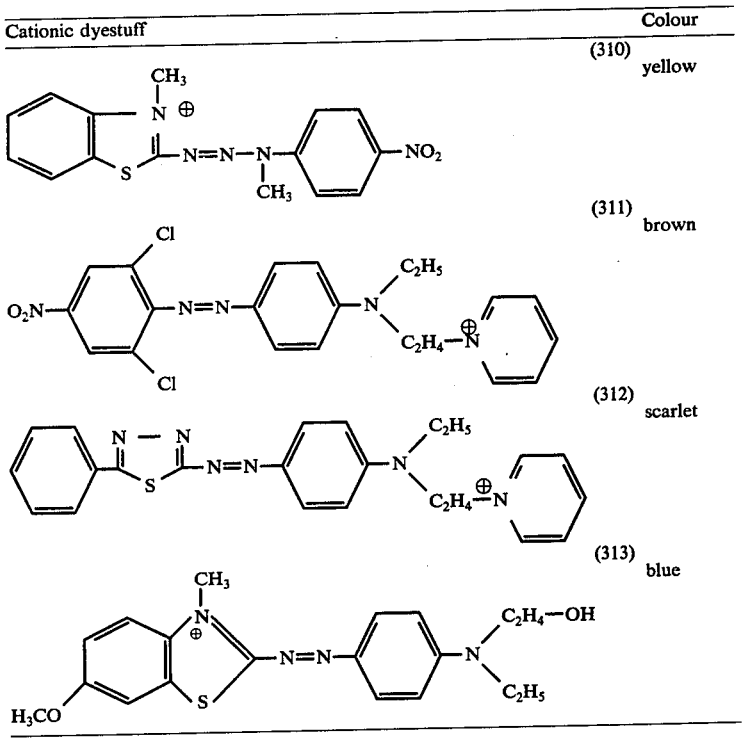

EXAMPLE 3

The procedure according to Example 2 is followed, using the following coating solutions:

a.
143 ml of a 0.336 molar aqueous calcium bis-acrylate solution,
1.3 g of acrylamide,
42 ml of a 15% strength aqueous gelatine,
200 mg of glycerol or polyoxyethylene sorbitol,
2 ml of a 10% strength solution of N-(methylol) perfluoroalkylsulphonamide, etherified with polyethylene glycol (wetting agent),
200 mg of the compound of the formula (304)

-continued

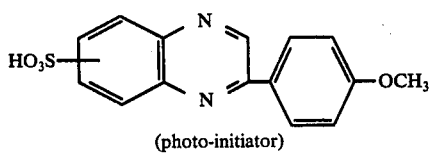

(photo-initiator)

and 190 mg of the compound of the formula

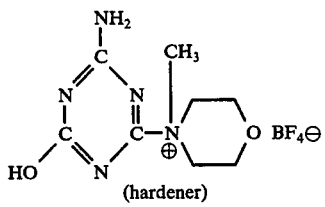

(314)

made up to 200 ml with water; and b.
143 ml of a 0.168 molar aqueous calcium bis-acrylate solution,
0.65 g of acrylamide and the other components as in 2a).

The polymeric images obtained also show good photographic properties in addition to their good mechanical properties.

EXAMPLE 4

The procedure according to Example 2 is followed, using the following coating solutions:

a.
55.7 ml of a 1.6 molar aqueous calcium bis-acrylate solution,
96 ml of gelatin (10% strength aqueous solution),
2.4 g of acrylamide,
100 mg of glycerol or
2 ml of a 10% strength aqueous solution of an adduct of nonylphenol with 5 mols of ethylene oxide and
300 mg of the compound of the formula (302) (photo-initiator), b. As 4a, but with 500 mg of the compound of the formula (315)

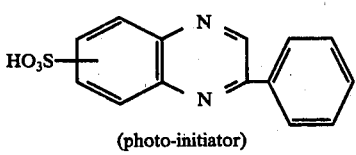

(photo-initiator)

and c. As 4a), but with
500 mg of the compound of the formula 113) and
200 mg of glyoxal (hardener).

The materials produced with coating solutions (a) to (c) are outstandingly suitable for the preparation of stable polymeric images by means of photo-polymerisation.

EXAMPLE 5

For the preparation of other suitable photo-polymerisable materials the procedure according to Example 2 is followed, using the following coating solutions:

a.
160 ml of a 1.4 molar aqueous barium bis-acrylate solution,
42 ml of a 15% strength aqueous gelatine,
6.47 g of acrylamide,
200 mg of glycerol or polyoxyethylene sorbitol,
2 ml of a 10% strength aqueous solution of an adduct of nonylphenol with 5 mols of ethylene oxide,
500 mg of the compound of the formula (315) and
500 mg of the compound of the formula (301);

b. As 5a), but with 160 ml of 0.7 molar aqueous barium bis-acrylate solution and 3 g of acrylamide; and c. As 5a), but with 160 ml of 1.1 molar aqueous strontium bis-acrylate solution and 500 mg of the compound of the formula (302).

EXAMPLE 6 a. A solution of the following composition is coated onto a cellulose triacetate film (surface area 254 cm$^2$) covered with hardened gelatine:
100 mg of acrylamide,
100 mg of N-octylacrylamide,
7 mg of N,N'-methylene-bis-acrylamide,
3 ml of gelatine (1.5% strength aqueous emulsion),
0.5 ml of a 0.19% strength aqueous solution of the compound of the formula (307),
1.4 mg of the compound of the formula (301),
0.8 ml of a 0.12% strength aqueous solution of N-(methylol)perfluoroalkylsulphonic acid amide, etherified with polyalkylene glycol (wetting agent) and
5.5 ml of methanol.

After application to the carrier material this layer is dried and then subjected to photo-polymerisation. Developing is carried out as described in Example 2, but with a 1:1 mixture of ethanol-water. A stable polymeric image which is resistant to abrasion is obtained.

b. Equally good results are obtained if a coating solution of the following composition is used:
2 ml of acrylamide (1.6 molar solution in ethanol),
7.5 mg of N,N'-methylene-bis-acrylamide,
3 ml of gelatine (1.5% strength aqueous emulsion),
50 mg of glycerol,
2 ml of a 0.06% strength aqueous solution of N-(methylol)-perfluoroalkylsulphonamide, etherified with polyethylene glycol (wetting agent),
1.4 mg of the compound of the formula (301) and
0.5 ml of the compound of the formula (307) (0.19% strength aqueous solution).

EXAMPLE 7 a. A solution of the following composition is coated onto a cellulose triacetate film (surface area 254 cm$^2$) covered with hardened gelatine:
1 ml of acrylamide (1.6 molar solution in alcohol),
2.4 ml of barium bis-acrylate (1.4 molar aqueous solution),
3 ml of gelatine (1.5% strength aqueous solution),
1.6 ml of polyvinyl alcohol (4.1% strength aqueous solution),
17 mg of the compound of the formula (316)

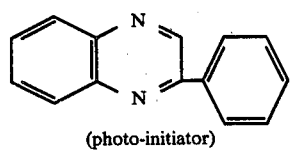

(photo-initiator)

in
2 ml of ethanol, and
0.5 ml of the compound of the formula (307) ((0.2% strength aqueous solution), or b. Coating solution as 7a), but with 1 ml of polyacrylamide (2% strength aqueous solution) in place of polyvinyl alcohol.

The materials coated with the coating solutions (a) and (b) are subjected to photo-polymerisation and lead to stable polymeric images.

EXAMPLE 8

The following coating solutions (for 254 cm² of surface area) can also be used for the preparation of photopolymerisable materials and, after appropriate developing, for stable relief images:

a.
0.4 g of ethylene-maleic anhydride copolymer (EMA-11, Monsanto) in 3.5 ml of water,
0.1 g of diacetoneacrylamide,
0.3 g of acrylamide in 1 ml of water,
0.03 g of N,N'-methylene-bis-acryl amide
0.02 g of the compound of the formula

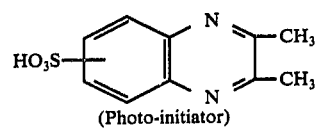

(317)

(Photo-initiator)

in
4 ml of water-ethanol (1:1),
1 ml of p-toluenesulphinate ($3 \cdot 10^{-2}$m) and
50 mg of glycerol (hardener), and b.
4.5 ml of methyl vinyl ether-maleic anhydride copolymer (2% strength) (Gantrez AN 139),
0.2 g of N-octylacrylamide,
0.008 g of N,N-bis-acrylamide,
0.001 g of the compound of the formula (304) in 3 ml of ethanol and
0.05 g of glycerol (hardener).

EXAMPLE 9

A cellulose triacetate film (or polyester film) covered with hardened gelatine is coated with 60 ml/m² of the following coating solution.

a. 14.3 ml of 1.68 molar aqueous calcium acrylate solution, 6.47 g of acrylamide, 42 ml of 15% strength aqueous gelatine, 200 mg of glycerol of polyoxyethylene sorbitol, 2 ml of a 10% strength solution or N(methylol)perfluoroalkylsulphonamide etherified with polyethylene glycol, 200 mg of the compound of the formula

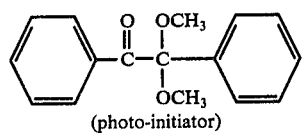

(318)

(photo-initiator)

and 190 mg of the compound of the formula (305) (hardener) made up to 200 ml with water;

b. as coating solution (a), but with 240 mg of the compound of the formula (306) (hardener)

c. as coating solution (a), but with 389 mg of the compound of the formula (307) (hardener)

d. as coating solution (a), but with 200 mg of the compound of the formula (308) (hardener)

e. as coating solution (e), but with 100 mg of dichlorohydroxy-s-triazine (sodium salt) (hardener), f. as coating solution (a), but with 280 mg of the photoinitiator, g. as coating solution (a), but with an additional 34 ml of a 10% strength chromium alum solution, h. as coating solution (a), but with 10 g of sodium vinylsulphonate in place of acrylamide, or i. as coating solution (a), but with 1 g of sulphoethyl acrylate in place of acrylamide.

k. Comparative example: As coating solution (a), but without hardener.

l. Comparative example (Example 10 from U.S. Pat. No. 3,097,096).

Solution of: 20 g of acrylamide, 0.2 g of N,N'-methylene-bis-acrylamide, 0.05 g of riboflavin, 5 g of gelatine and 0.1 g of crystal violet, made up to 100 ml with water.

The solution is coated in accordance with (1a) onto a triacetate film, dried and subjected to a photopolymerisation.

The films coated with these coating solutions are then dried at temperatures of about 30° C.

The film thus treated is exposed under a photographic step wedge (12 steps) for 30 seconds by the contact process using a 400 Watt mercury high-pressure lamp at a distance of 40 cm. The film is then washed with water (fixed) and thereafter dyed with a 2% strength aqueous solution of the dyestuff of the formula (309) Thereafter the film is washed with water for 2 to 3 seconds and dried. All 12 wedge steps are clearly visible. The fixing, dyeing and washing out can be carried out in a customary roller processor.

The following data are obtained (a) – (i):

| Films treated with | Exposure time | Maximum colour density at 500 nm | Absolute sensitivity S [in mJoule/cm OD = 1] |
|---|---|---|---|
| a,b,c,d,e,f,g,h,i | 3 seconds | 2.28 | |
| a,b,c,d,e,f,g,h,i | 5 seconds | 3.20 | |
| a,b,c,d,e,f,g,h,i | 10 seconds | 3.52 | 3 to 10 mJ/cm² |
| a,b,c,d,e,f,g,h,i | 15 seconds | 3.84 | |
| a,b,c,d,e,f,g,h,i | 20 seconds | 3.84 | |

The absolute sensitivity S is measured at a wavelength of 366 nm and a light intensity of $1.1 \cdot 10^{-9}$ Einstein $cm^{-2}sec^{-1}$.

The polymeric images on the films which were coated with the coating solutions (a) to (i) are, in the wet state, resistant to abrasion.

In the case of the film coating with coating solution (k), on the other hand, the applied layer has only an inadequate strength. Even the contact with water necessary for developing is sufficient to dissolve the layer, so that it is not possible to prepare stable polymeric images. On developing (dissolving out the unpolymerised parts and the binder) with water, the film treated with the coating solution (1) shows a relief for a short time, but the relief is very easily stripped from the carrier and has no mechanical strength. The relief is unsuitable for further treatment or further processing. The following cationic dyestuffs of the formulae (310) to (313) can be used for the preparation of negative reproductions with the relief images according to the invention.

EXAMPLE 10

The procedure according to Example 9 is followed, using the following coating solutions:

a. 143 ml of 0.336 molar aqueous calcium bis-acrylate solution, 1.3 g of acrylamide, 42 ml of 15% strength aqueous gelatine, 200 mg of glycerol or polyoxyethylene sorbitol, 2 ml of a 10% strength solution of N-(methylol)-perfluoroalkylsulphonamide etherified with polyethylene glycol, 100 mg of methylene blue - alkylthiourea (photo-initiator) and 190 mg of the compound of the formula (305) (hardener) made up to 200 ml with water.

The polymeric images obtained also show good photographic properites in addition to their good mechanical properties.

EXAMPLE 11

The procedure according to Example 9 is followed, using the following coating solutions:

a. 55.7 ml of 1.6 molar aqueous calcium bis-acrylate solution, 96 ml of gelatine (10% strength aqueous solution), 2.4 g of acrylamide, 100 mg of glycerol or 2 ml of a 10% strength aqueous solution of an adduct of nonylphenol with 5 mols of ethylene oxide, 100 mg of riboflavin (photoinitiator) and 190 mg of the compound of the formula (305) (hardener): and b. as (11a), but with 200 ml of glyoxal (hardener). The materials produced with the coating solution are suitable for the preparation of stable images by means of photopolymerisation.

EXAMPLE 12

For the preparation of other suitable photopolymerisable materials the procedure according to Example 9 is followed, using the following coating solutions:

a. 160 ml of 1.4 molar aqueous barium bis-acrylate solution, 42 ml of 15% strength aqueous gelatine, 6.47 g of acrylamide, 200 mg of glycerol or polyoxyethylene sorbitol, 2 ml of a 10% strength aqueous solution of an adduct of nonylphenol with 5 mols of ethylene oxide, 200 mg of the compound of the formula

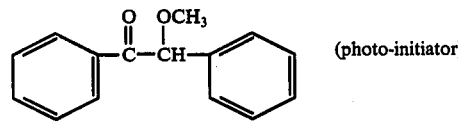

(319) (photo-initiator)

and 500 mg of the compound of the formula (305); and b. as (12a), but with 160 ml of a 0.7 molar aqueous barium bis-acrylate solution and 3 g of acrylamide.

EXAMPLE 13

A solution of the following composition is coated onto a cellulose triacetate film (surface area 254 cm²) covered with hardened gelatine: 100 mg of acrylamide, 100 Mg of octylacrylamide, 7 mg of N,N'-methylene-bis-acrylamide, 3 ml of gelatine (1.5% strength aqueous emulsion), 0.5 ml of a 0.19% strength aqueous solution of the compound of the formula (307), 1.4 mg of diphenyl disulphide (photo-initiator), 0.8 ml of a 0.12% strength aqueous solution of N-(methylol)-perfluoroethylsulphonamide etherified with polyethylene glycol, and 5.5 ml of methanol.

After application to the carrier material this layer is dried and then subjected to a photopolymerisation. The developing is carried out as described in Example 9, but using a 1:1 mixture of ethanol-water. A stable polymeric image which is resistant to abrasion is obtained.

EXAMPLE 14 a. A solution of the following composition is coated onto a cellulose triacetate film (surface area: 254 cm²) covered with hardened gelatine: 1 ml of acrylamide (1.6 molar solution in alcohol), 2.4 ml of barium acrylate (1.4 molar aqueous solution), 3 ml of gelatine (1.5% strength aqueous solution), 1.6 ml of polyvinyl alcohol (4.1% strength aqueous solution), 17 mg of azo-bis-isobutyronitrile (photoinitiator) and 0.5 ml of the compound of the formula (307) (0.2% strength aqueous solution).

b. Coating solution as (14a), but with 1 ml of polyacrylamide (2% strength aqueous solution) in place of polyvinyl alcohol.

The materials coated with the coating solutions (a) and (b) are subjected to photopolymerisation and lead to stable relief images.

EXAMPLE 15

The following coating solutions (for 254 cm² of surface) can also be used for the preparation of photopolymerisable materials and, after appropriate developing, for stable relief images:

a. 0.4 g of ethylene-maleic anhydride copolymer (EMA-11, Monsanto) in 3.5 ml of water, 0.1 g of diacetoneacrylamide, 0.3 g of acrylamide, 0.03 g of N,N'-methylene-bis-acrylamide in 1 ml of water, 0.02 g of the compound of the formula (318) (photo-initiator) in 4 ml of water-ethanol (1:1), 1 ml of p-toluenesulphinate (3.10⁻² m) and 50 mg of glycerol (hardener);

b. 4.5 ml of methyl vinyl ether-maleic anhydride copolymer (2% strength) (Gantrez AN 139), 0.2 g of N-octylacrylamide, 0.008 g of N,N-bis-acrylamide, 0.001 g of the compound of the formula (318) in 3 ml of ethanol (photo-initiator) and 0.05 g of glycerol (hardener); and c. 5 ml of polyvinyl alcohol (4% strength aqueous solution), 1 ml of acrylamide (1.6 molar solution in ethanol), 2.4 ml of barium acrylate (1.4 molar aqueous solution), 18 mg of benzoin (photo-initiator), 0.5 ml of the compound of the formula (307) (0.2% strength aqueous solution) and 2 ml of a 0.06% strength aqueous solution of N-(methylol)-perfluoroalkylsulphonamide etherified with polyethylene glycol.

I claim:
1. Photo-polymerisable material, suitable for the preparation of stable polymeric images, characterised in that it contains, on a carrier, at least one layer composed of
   1. ethylenically unsaturated monomers which are soluble in water or water-alcohol mixtures and which contain one or more terminal double bonds and at least one polar atom grouping with a lone electron pair,
   2. as the photo-initiator which, conjointly with the monomer (1) and/or the binder (3a), forms a photoredox pair, a compound having a ring system of the formula

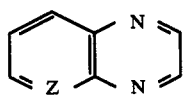

(1)

wherein Z is a nitrogen atom or the group C-R, R is hydrogen or a substituent and the compound is optionally quaternised, and 3. as a matrix for the monomer (1), a swellable reaction product of at least one
   a. macromolecular binder which is soluble in water or water-alcohol mixtures and which has at least one polar atom grouping containing a lone electron pair, with
   b. a hardener, the hardener being different from the monomers of the component (1), and optionally
4. a chemically inert macromolecular compound which does not react with the binder (a) or the hardener (b).

2. Photo-polymerisable material according to claim 1, characterised in that acrylic acid, methacrylic acid, unsubstituted or substituted acrylic or methacrylic acid or amides or monovalent to trivalent metal salts of acrylic or methacrylic acid, or N-vinylpyrrolidone or their mixtures, vinylsulphonic acid or acrylalkylsulphonic acids of the formulae $$CH_2 = CHCOOA\ SO_3H\ or\ CH_2=C\ COOA\ SO_3H,$$
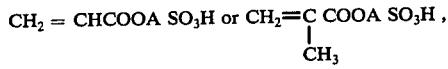

wherein A is an unbranched or branched alkylene radical with 1 to 6 carbon atoms, are used as component (1).

3. Photo-polymerisable material according to claim 1, characterised in that amides or monovalent metal salts of acrylic or methacrylic acid, or N-vinylpyrrolidone are used as component (1).

4. Photo-polymerisable material according to claim 1, characterised in that N,N'-alkylene-bis-acrylamides, diacrylamides and triacrylamides or divalent or trivalent metal salts of acrylic or methacrylic acid are used as component (1).

5. Photo-polymerisable material according to claim 4, characterised in that alkylene-bis-acrylamides of the formula

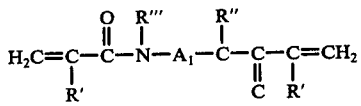

wherein $A_1$ is an alkylene group with 1 to 6 carbon atoms, R' is hydrogen or methyl and R''' and R'' are hydrogen or alkyl with 1 to 4 carbon atoms, are used as component (1).

6. Photo-polymerisable material according to claim 2, characterised in that acrylamide, methacrylamide, the sodium salts, potassium salts, calcium salts and barium salts of acrylic or methacrylic acid and methylene-bis-acrylamide are used.

7. Photo-polymerisable material according to claim 2, characterised in that acrylamide, N-octylacrylamide, diacetoneacrylamide, N,N-bis-acrylamide, N,N'-methylene-bis-acrylamide, calcium bis-acrylate, strontium bis-acrylate or barium bisacrylate, vinylsulphonic acid or acrylethylsulphonic acid or mixtures thereof are used as component (1).

8. Photo-polymerisable material according to claim 1, characterised in that the photo-initiator is a diazine compound of the formula

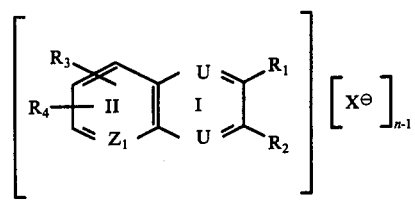

wherein $n$ is 1 or 2, $Z_1$ denotes a nitrogen atom or a group

one U denotes a nitrogen atom and if $n$ is 1, the other U also denotes a nitrogen atom, and if $n$ is 2 denotes a group of the composition

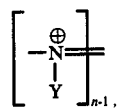

X denotes an anion, Y denotes an alkyl radical which is optionally substituted further, $R_1$ and $R_2$ independently of one another denote a hydrogen atom or an alkyl, alkoxy, aroyl, aryloxy or aralkoxy radical which is optionally substituted further, or $R_1$ and $R_2$, conjointly with two carbon atoms of the ring I, denote a heterocyclic or isocyclic ring, and $R_3$, $R_4$ and $R_5$ independently of one another denote a hydrogen atom, an alkyl, alkoxy, aryloxy or aralkoxy radical which is optionally substituted further, a halogen atom, a nitro group, a cyano group, a hydroxyl group, an amino group which is optionally substituted further, an alkylammonium group, a carboxylic acid group, a carboxylic acid amide group, a carboxylic acid alkyl ester group or a sulphonic acid group or two of $R_3$, $R_4$ and $R_5$, conjointly with two adjacent carbon atoms of the ring II, denote an isocyclic or heterocyclic ring.

9. Photo-polymerisable material according to claim 8, characterised in that the photo-initiator corresponds to the formula

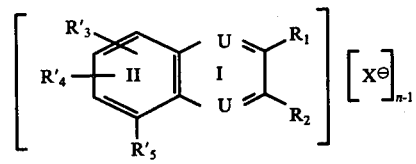

wherein $n$, U, X, $R_1$ and $R_2$ have the meaning indicated, one of the symbols $R'_3$, $R'_4$ and $R'_5$ has the meaning indicated for $R_3$, $R_4$ and $R_5$, the second of these three symbols denotes a hydrogen atom, a halogen atom, an amino group or an alkyl or alkoxy group and the third denotes a hydrogen atom or an alkoxy group, or wherein two of these symbols are members of a ring of the composition indicated and the third denotes a hydrogen atom or an alkoxy group.

10. Photo-polymerisable material according to one of claims 8 and 9, characterised in that the photo-initiator corresponds to the formula

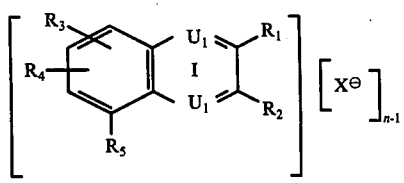

wherein $n$, $R_1$, $R_2$, $R_3$, $R_4$, $R_5$ and X have the meaning indicated, one $U_1$ denotes a nitrogen atom and, if $n$ is 1, the other $U_1$ also denotes a nitrogen atom, and if $n$ is 2 denotes a

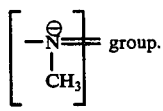 group.

11. Photo-polymerisable material according to claim 10, characterised in that the photo-initiator corresponds to the formula

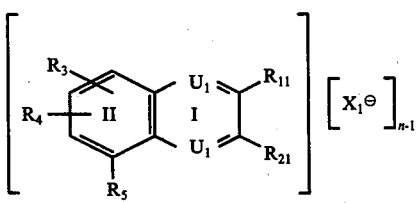

wherein $n$, $U_1$, $R_3$, $R_4$ and $R_5$ have the meaning indicated, $R_{11}$ and $R_{21}$ denote a benzene radical which is optionally further substituted, a benzoyl group, a methyl group which is optionally substituted further or a hydrogen atom, or $R_{11}$ and $R_{21}$, conjointly with two carbon atoms of the ring I, denote a five-membered to six-membered heterocyclic or isocyclic ring and $X_1^-$ denotes one of the anions $Cl^-$, $I^-$, $ClO_4^-$, $CH_3SO_4^-$, $FSO_3^-$, $BF_4^-$, $PF_6^-$ and $AsF_6^-$.

12. Photo-polymerisable material according to claim 11, characterised in that the photo-initiator corresponds to the formula

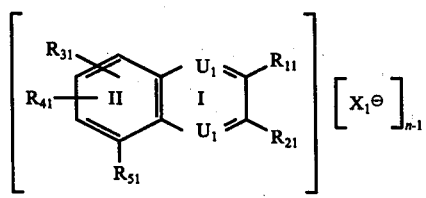

wherein $n$, $U_1$, $R_{11}$, $R_{21}$ and $X_1$ have the meaning indicated and $R_{31}$, $R_{41}$ and $R_{51}$ denote a hydrogen atom, a lower alkyl group, a chlorine atom, a nitro group, a primary amino group, an acylamino group, a triemthylammonium group, a carboxylic acid amide group which is optionally substituted further by one to two lower alkyl groups or a carboxylic acid group, a carboxylic acid methyl ester group or a carboxylic acid ethyl ester group or a sulphonic acid group, or two of $R_{31}$, $R_{41}$ and $R_{51}$, conjointly with two adjacent carbon atoms of the ring II, denote an isocyclic or heterocyclic ring.

13. Photo-polymerisable material according to claim 12, characterised in that the photo-initiator corresponds to the formula

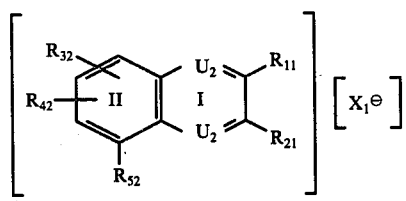

wherein $R_{11}$, $R_{21}$ and $X_1$ have the meaning indicated, one $U_2$ denotes a nitrogen atom and the other denotes

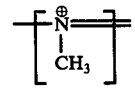

group and $R_{32}$, $R_{42}$ and $R_{52}$ denote a hydrogen atom or a methyl, methoxy, ethoxy, nitro, amino, acetylamino, trimethylammonium or sulphonic acid group, or two of $R_{32}$, $R_{42}$ and $R_{52}$, conjointly with two adjacent carbon atoms of the ring II, denote an isocyclic or heterocyclic ring.

14. Photo-polymerisable material according to claim 13, characterised in that the photo-initiator corresponds to the formula

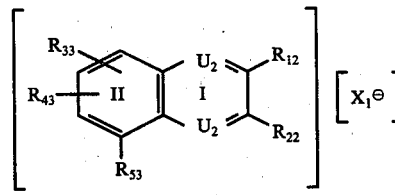

wherein $U_2$ and $X_1$ have the meaning indicated, $R_{12}$ and $R_{22}$ denote a phenyl group, a benzoyl radical, a phenylsulphonic acid group, a methoxyphenyl group, a hydroxymethyl group or a hydrogen atom and $R_{33}$, $R_{43}$ and $R_{53}$ denote a hydrogen atom or a methyl, methoxy, ethoxy, nitro, amino, trimethylammonium or sulphonic acid group, or two or $R_{33}$, $R_{43}$ and $R_{53}$, conjointly with two adjacent carbon atoms of the ring II, denote a dioxole, dioxane or pyridine ring.

15. Photo-polymerisable material according to claim 14, characterised in that th photo-initiator corresponds to the formula

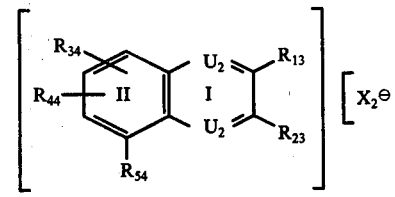

wherein $U_2$ has the meaning indicated, $R_{13}$ and $R_{23}$ each denote a phenyl group or each denote a methyl group, $R_{34}$, $R_{44}$ and $R_{54}$ denote a hydrogen atom, a methyl group or a methoxy group and $X_2^-$ denotes one of the anions $I^-$, $ClO_4^-$ and $CH_3SO_4^-$.

16. Photo-polymerisable material according to claim 12, characterised in that the photo-initiator is a quinoxaline of the formula

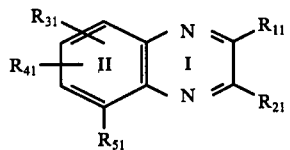

wherein $R_{11}$, $R_{21}$, $R_{31}$, $R_{41}$ and $R_{51}$ have the meaning indicated.

17. Photo-polymerisable material according to claim 15, characterised in that the photo-initiator corresponds to the formula

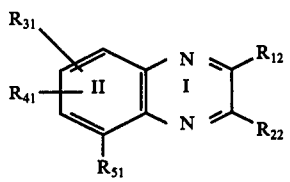

wherein $R_{12}$, $R_{22}$, $R_{31}$, $R_{41}$ and $R_{51}$ have the meaning indicated.

18. Photo-polymerisable material according to claim 17, characterised in that the photo-initiator corresponds to the formula

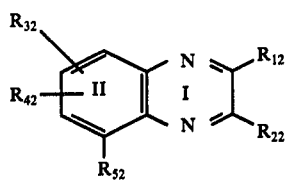

wherein $R_{12}$, $R_{22}$, $R_{32}$, $R_{42}$ and $R_{52}$ have the meaning indicated.

19. Photo-polymerisable material according to claim 18, characterised in that the photo-initiator corresponds to the formula

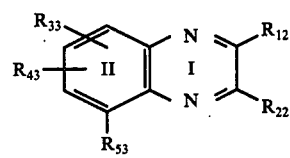

wherein $R_{12}$, $R_{22}$, $R_{33}$, $R_{43}$ and $R_{53}$ have the meaning indicated.

20. Photo-polymerisable material according to claim 19, characterised in that the photo-initiator corresponds to the formula

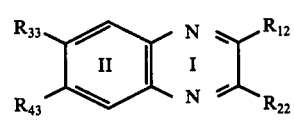

wherein $R_{12}$ and $R_{22}$ are phenyl, methoxyphenyl,

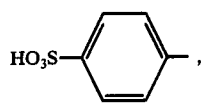

benzoyl, hydroxymethyl or hydrogen and $R_{33}$ and $R_{43}$ are hydrogen, methyl, methoxy, alkoxy, nitro, amino or $-SO_3H$.

21. Photo-polymerisable material according to claim 20, characterised in that the photo-initiator corresponds to the formula

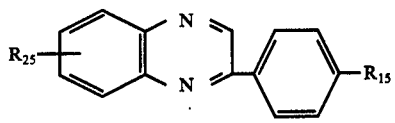

wherein $R_{15}$ is hydrogen, methoxy or $-SO_3H$ and $R_{25}$ is hydrogen or $-SO_3H$, the compound containing at most one $-SO_3H$ group.

22. Photo-polymerisable material according to claim 1, characterised in that gelatine, chemically modified gelatine, polyvinyl alcohol or optionally hydrolysed copolymers of maleic anhydride and olefines, or mixtures thereof, are used as the binder (3a).

23. Photo-polymerisable material according to claim 22, characterised in that gelatine, polyvinyl alcohols, ethylenemaleic anhydride copolymers or methyl vinyl ether-maleic anhydride copolymers are used as the binders.

24. Photo-polymerisable material according to claim 1, characterised in that aldehydes, N-methylol compounds, ketones, polycarbonates, sulphuric acid esters, sulphonyl halides, α-chloroketones and α-bromoketones, epoxides, aziridines, divinylsulphones, isocyanates, carbodiimides, polyhydric alcohols, acrylic acid compounds which are different from compenent (1) and triazine derivatives are used as the hardeners of component (3b).

25. Photo-polymerisable material according to claim 24, characterised in that aldehydes, ketones, polyhydric alcohols, isocyanates, carbodiimides, triazone derivatives and acrylic acid derivatives which are different from the component 1) are used as the component (3b).

26. Photo-polymerisable material according to claim 25, characterised in that glycerol, diethylene glycol and triethylene glycol are used especially as hardeners (3b) for olefinemaleic anhydride copolymers.

27. Photo-polymerisable material according to claim 25, characterised in that halogeno-1,3,5-triazine compounds of the formula

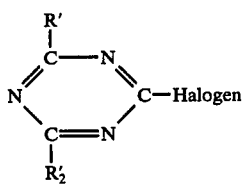

wherein $R'_1$ denotes an organic radical with at least one acidic group which confers solubility in water and $R'_2$ denotes a halogen atom, an organic radical with one acidic group which confers solubility in water, a hydrocarbon radical or a substituent which is bonded to the triazine ring via an oxygen atom, sulphur atom or nitrogen atom, and Halogen especially denotes chlorine, are used as component 3b).

28. Photo-polymerisable material according to claim 27, characterised in that compounds in which at least one of the radicals $R'_1$ and $R'_2$ is a halogen atom or a hydroxyl, methoxy or an optionally substituted phenoxy or amino group, are used as component 3b).

29. Photo-polymerisable material according to claim 25, characterised in that compounds of the formula

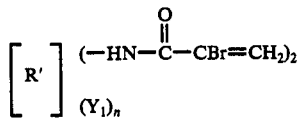

wherein $R'$ denotes an aromatic radical with 1 to 2 benzene rings, $Y_1$ denotes a sulphonic acid group or carboxylic acid group and $n$ denotes an integer having a value of at most 4, are used as component 3b).

30. Photo-polymerisable material according to claim 25, characterised in that acrylic acid derivatives of the formula

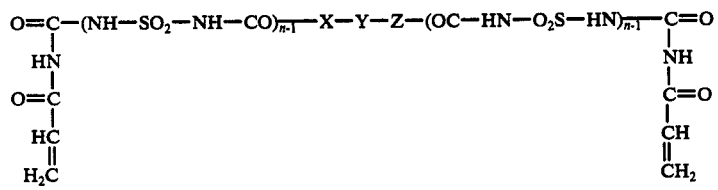

wherein X and Z denote an oxygen atom, a sulphur atom, a —NH— group or a —NH—CO— group bonded by its carbon atom, to Y, and Y denotes a —(CH$_2$)$_m$— group, a —CH$_2$—CH$_2$[O—CH$_2$—CH$_2$]$_q$— group, a —(CH$_2$)$_r$—O—(CH$_2$)$_r$ group or a —(CH$_2$)$_r$—S—(CH$_2$)$_r$ group and Y also can represent a direct bond or a —CO— group, if X and Z each denote —NH— groups and $n$ is 1, $n$, $m$, $r$ and $q$ denoting positive integers and $n$ being at most 2, $m$ being at most 14, $q$ being 2 to 4 and $r$ being at most 4, are used as component 3b).

31. Photo-polymerisable material according to claim 25, characterised in that compounds of the formula

wherein A denotes an aldehyde group or a functionally modified aldehyde group, E+ denotes an ammonium, phosphonium or sulphonium radical and X⁻ denotes an anion, are used as component 3b).

32. Photo-polymerisable material according to claim 25, characterised in that compounds of the formula

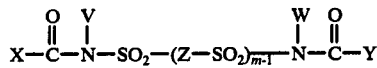

wherein V and W independently of one another denote a hydrogen atom or an organic radical, X and Y independently of one another denote a vinyl group which is optionally substituted further or a group which can be converted into a vinyl group, Z denotes an organic bridge member and m denotes an integer having a value from 1 to 11, or salts of such compounds, are used as component 3b).

33. Photo-polymerisable material according to claim 25, characterised in that compounds of the formula

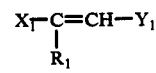

wherein $R_1$ denotes a hydrogen atom, an alkyl group, a cycloalkyl radical, an aralkyl radical, an aryl radical or a heterocyclic radical, $X_1$ denotes a heterocyclic radical bonded to the —$CR_1$=CH— group via a ring nitrogen atom and $Y_1$ denotes an optionally fnctionally modified aldehyde group, are used as component 3b).

34. Photo-polymerisable material according to claim 25, characterised in that triazine compounds of the formula

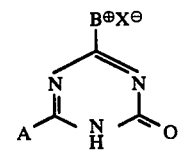

wherein A is hydrogen, hydroxyl, halogen, acylamino, an immonium-ether radical, the radical or the formula

wherein $R_1$ and $R_2$ independently of one another are hydrogen, optionally substituted alkyl, alkenyl, alkinyl, cycloalkyl with 5 or 6 carbon atoms, aryl or aralyky or, conjointly with the nitrogen atom to which they are bonded, form a saturated ring which optionally contains yet further hetero-atoms, or the radical of the formula

wherein $R_3$, $R_4$ and $R_5$ independently of one another are hydrogen, optionally substituted alkyl, alkenyl, alkinyl, cycloalkyl, aryl or aralyl or, conjointly with the nitrogen atom to which they are bonded, form a saturated ring which optionally contains yet further heteroatoms, B+ is an ammonium or phosphonium radical and X⁻ is an anion, preferably a chloride, iodide, perchlorate, fluoborate, hexafluoroarsenate or hexafluorophosphate anion, are used as component 3b).

35. Photo-polymerisable material according to claim 25, characterised in that compounds of the formula

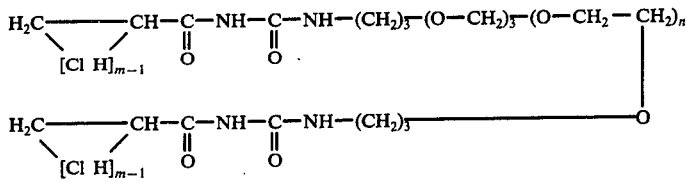

wherein $m$ is 1 or 2 and $n$ is an integer having a value from 1 to 100, prefferably 1 to 10, are used as component 3b).

36. Photo-polymerisable material according to claim 25, characterised in that glycerol, polyoxyethylene sorbitol or glyoxal is used as component 3b).

37. Photo-polymerisable material according to claim 1, characterised in that polyacrylamide or poly-N-vinylpyrrolidone or poly-N-vinylcarbazole is used as component (4).

38. Process for the manufacture of the photo-polymerisable material according to one of claims 1 to 37, suitable for the preparation of stable polymeric images, charactrised in that a solution containing
  1. ethylenically unsaturated monomers which are soluble in water or water-alcohol mixtures and which contain one or more terminal double bonds and at least one polar atom grouping with a lone electron pair,
  2. a photo-initiator which, conjointly with the monomer (1) and/or the binder (3a), forms a photo-redox pair and has a ring system of the formula

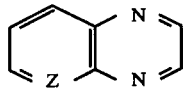 (1)

wherein Z is a nitrogen atom or the group C-R, R is hydrogen or a substituent and the compound is optionally quaternished,
  3a. at least one macromolecular binder which is soluble in water or water-alcohol mixtures and which has at least one polar atom grouping containing a lone electron pair,
  3b. a hardener for the binder, the hardener being different from the monomer of component (1), and
  4. at least one chemically inert macromolecular compound which does not react with the binder (3a) or the hardener (3b), is applied to a carrier as a layer and is dried.

39. Process for recording information, in particular for preparing stable polymeric images, by photopolymerisation in a matrix, characterised in that the photo-polymerisable material according to claim 1 is exposed image-wise and subsequently treated with a solvent, which dissolves the components (1) and optionally (2), but which does not dissolve the polymer formed from (1) by exposure and the hardened product from the components (3a) and (3b) which was formed in the manufacture of the photo-polymerisable material, and the solvent is then removed by drying.

40. The stable polymeric images prepared by the process according to claim 39.

41. Photopolymerisable material, suitable for the preparation of stable polymeric images, containing on a carrier at least one layer composed of at least one ethylenically unsaturated, photopolymerisable monomer and at least one photo-initiator, characterised in that the monomer is present in a matrix of a swellable reaction product from a chemically hardenable, non-light-sensitive, swellable macromolecular compound and a hardener, and optionally a macromolecular compound which is chemically inert towards the chemically hardenable compound and the hardener.

42. Photopolymerisable material according to claim 41, characterised in that the hardenable macromolecular compounds are gelatine, modified gelatine, polyvinyl alcohols or optionally hydrolysed copolymers of olefines with maleic anhydride.

43. Photopolymerisable material according to claim 42, characterised in that the hardenable macromolecular compounds are gelatine, polyvinyl alcohols, ethylene maleic anhydride copolymers or methyl vinyl ether-maleic anhydride copolymers.

44. Photopolymerisable material according to claim 41, characterised in that the hardeners are aldehydes, N-methylol compounds, polycarbonates, sulphuric acid esters, sulphonyl halides, α-chloroketones and α-bromoketones, epoxides, aziridines, divinylsulphones, isocyanates, carbodiimides, polyhydric alcohols, acrylic acid compounds which are different from the ethylenically unsaturated, photo-polymerisable monomers, and triazine derivatives.

45. Photopolymerisable material according to claim 44, characterised in that aldehydes, polyhydric alcohols, isocyanates, carbodiimides, triazine derivatives and acrylic acid derivatives are used as hardeners.

46. Photopolymerisable material according to claim 45, characterised in that glycerol, diethylene glycol and triethylene glycol are used, especially as crosslinking agents for olefine-maleic anhydride copolymers.

47. Photopolymerisable material according to claim 45, characterised in that halogeno-1,3,5-triazine compounds of the formula

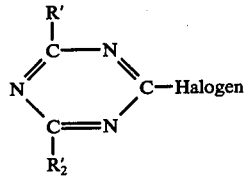

wherein $R'_1$ denotes an organic radical with at least one acidic group conferring solubility in water and $R'_2$ denotes a halogen atom, an organic radical with an acidic group conferring solubility in water, a hydrocarbon radical or a substituent which is bonded to the triazine ring via an oxygen atom, sulphur atom or nitrogen atom and Halogen especially denotes chlorine, are used as hardeners.

48. Photoplymerisable material according to claim 45, characterised in that compounds in which at least one of the radicals $R_1'$ and $R_2'$ is a halogen atom, a hydroxyl or methoxy group or an optionally substituted phenoxy or amino group, are used as hardeners.

49. Photopolymerisable material according to claim 45, characterised in that compounds of the formula

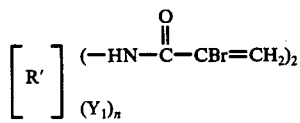

wherein R' denotes an aromatic radical with 1 to 2 benzene rings, $Y_1$ denotes a sulphonic acid group or a carboxylic acid group and $n$ denotes an integer having a value of at most 4, are used as hardeners.

50. Photopolymerisable material according to claim 45, characterised in that acrylic acid derivatives of the formula

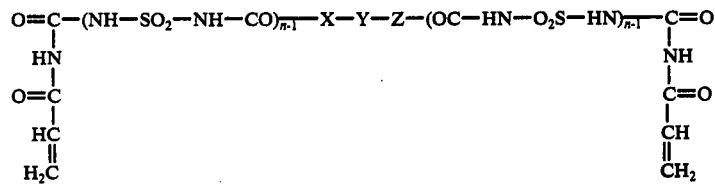

wherein X and Z denote an oxygen atom, a sulphur atom, a —NH— group or a —NH—CO— group bonded, via its carbon atom, to Y and Y denotes a —$(CH_2)_m$— group, a —$CH_2CH_2$—$(O$—$CH_2CH_2)_q$— group, a —$(CH_2)_r$—O—$(CH_2)_r$— group or a —$(CH_2)_r$—S—$(CH_2)_r$— group, and Y can also represent a direct bond or a —CO— group, if X and Z each denote —NH— groups and $n$ is 1, $n$, $m$, $r$ and $q$ denoting positive integers and $n$ being at most 2, $m$ being at most 14, $q$ being 2 to 4 and $r$ being at most 4, are used as hardeners.

51. Photopolymerisable material according to claim 45, characterised in that compounds of the formula $$[A—CH=CH—E^\oplus] \ X^\ominus$$

wherein A denotes an aldehyde group or a functionally modified aldehyde group, E+ denotes an ammonium, phosphonium or sulphonium radical and X− denotes an anion, are used as hardeners.

52. Photopolymerisable material according to claim 45, characterised in that compounds of the formula

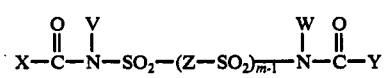

wherein V and W independently of one anoter denote a hydrogen atom or an organic radical, X and Y independently of one another denote a vinyl group, which is optionally substituted further, or a group which can be converted into a vinyl group, Z denotes an organic bridge member and $m$ denotes an integer having a value from 1 to 11, or salts of such compounds, are used as hardeners.

53. Photopolymerisable material according to claim 45, characterised in that compounds of the formula

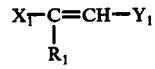

wherein $R_1$ denotes a hydrogen atom, an alkyl group, a cycloalkyl radical, an aralkyl radical, an aryl radical or a heterocyclic radical, $X_1$ denotes a heterocyclic radical which is bonded to the —$CR_1$=CH— group via a ring nitrogen atom and $Y_1$ denotes an optionally functionally modified aldehyde group, are used as hardeners.

54. Photopolymerisable material according to claim 45, characterised in that triazine compounds of the formula

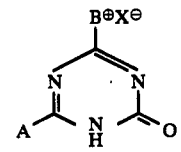

wherein A is hydrogen, hydroxyl, halogen, acylamino, an immonium-ether radical, the radical of the formula

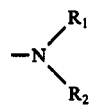

wherein $R_1$ and $R_2$ independently of one another are hydrogen, optionally substituted alkyl, alkenyl, alkinyl, cycloalkyl with 5 or 6 carbon atoms, aryl or aralkyl or, conjointly with the nitrogen atom to which they are bonded, form a saturated ring which optionally contains yet further heteroatoms, or the radical of the formula

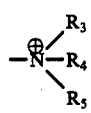

wherein $R_3$, $R_4$ and $R_5$ independently of one another are hydrogen, optionally substituted alkyl, alkenyl, alkinyl, cycloalkyl, aryl or aralkyl or, conjointly with the nitrogen atom to which they are bonded, form a saturated ring, which optionally contains yet further heteroatoms, B+ is an ammonium or phosphonium radical and X− is an anion, preferably a chloride, iodide, perchlorate, fluoborate, hexafluoroarsenate or hexafluorophosphate anion, are used as hardeners.

55. Photopolymerisable material according to claim 45, characterised in that compounds of the formula

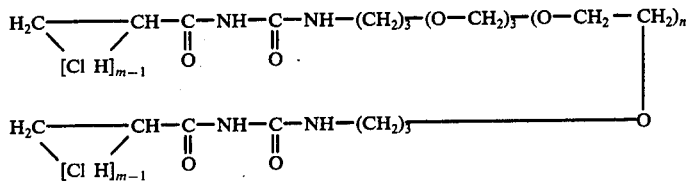

wherein m is 1 or 2 and n is an integer having a value from 1 to 100, preferably 1 to 10, are used as hardeners.

56. Photopolymerisable material according to claim 45, characterised in that glycerol, polyoxyethylene sorbitol or glyoxal are used as hardeners.

57. Photopolymerisable material according to claim 41, characterised in that polyacrylamide or poly-N-vinylpyrrolidone is used as the compound which is chemically inert towards the chemically hardenable compound and the hardener.

58. Photopolymerisable material according to claim 41, characterised in that the ethylenically unsaturated monomer is acrylic acid, methacrylic acid, unsubstituted or substituted acrylic or methacrylic acid, or amides or monovalent to trivalent metal salts of acrylic or methacrlyic acid, N-vinylpyrrolidone or their mixtures, vinylsulphonic acid or an acrylalkylsulphonic acid of the formulae $$CH_2 = CHCOOASO_3H$$

or

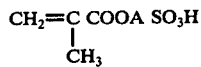

wherein A is an unbranched or branched alkylene radical with 1 to 6 carbon atoms.

59. Photopolymerisable material according to claim 58, characterised in that the monomer is amides or monovalent metal salts of acrylic or methacrylic acid, or N-vinylpyrrolidone.

60. Photopolymerisable material according to claim 58, characterised in that the monomer is N,N'-alkylene-bis-acrylamides, diacrylamides and triacylamides or divalent or trivalent metal salts of acrylic or methacrylic acid.

61. Photopolymerisable material according to claim 60, characterised in that monomer is alkylene-bis-acrylamides of the formula

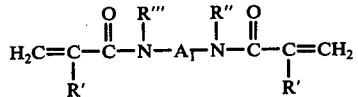

wherein $A_1$ is an alkylene group with 1 to 6 carbon atoms, R' is hydrogen or methyl and R''' and R'' are hydrogen or alkyl with 1 to 4 carbon atoms.

62. Photopolymerisable material according to claim 58, characterised in that the monomer is acrylamide, methacrylamide, the sodium salts, potassium salts, calcium salts barium salts of acrylic or methacrylic acid, and methylene-bis-acrylamide.

63. Photopolymerisable material according to claim 58, characterised in that the monomer is acrylamide, N-acrylamide, diacetoneacrylamide, N,N-bis-arylamide, N,N'-methylene-bis-acylamide, calcium bis-acrylate, strontium bis-acrylate or barium bis-arcylate, vinylsulphonic acid or acrylethylsulphonic acid or mixtures thereof.

64. Photocurable material according to claim 41, characterised in that ethylenically unsaturated photopolymerisable compounds are used which are soluble in lower alcohols with 1 to 4 carbon atoms and/or in water.

65. Photopolymerisable material according to claim 41, characterised in that the photoinitiator is benzophenone, fluorenone, benzathrone, benzoin, aromatic and aliphatic disulphides, S-acrylcarbamates, halosulphanes, alkylazo compounds, metal carbonyls, hexaaryl-bis-imidazoles, halogen-substituted stryenes, tribromomethane and photo-redox pairs of photochemically reducible compounds and, optionally mild reducing agents.

66. Photopolymerisable material according to claim 65, characterised in that the photoinitiator is photo-redox pairs of phenazine dyestuffs, acridine dyestuffs and xanthene dyestuffs, riboflavin and phenothiazine with tin chloride, ascorbic acid, glutathione, hydroxylamine, phenylhydrazine, allylthiourea, phosphines, arsines and sulphine compounds.

67. Process for recording information, in particular for preparing stable polymeric images, by photopolymerisation in a matrix, characterised in that the photopolymerisable material according to claim 41 is exposed image-wise and subsequently treated with a solvent, which dissolves the components (a) and, optionally, (b), but which does not dissolve the polymer formed from (a) by exposure and the hardened product from (c) and (d), which was formed in the manufacture of the photopolymerisable material, and the solvent is then removed by drying.

68. The stable polymeric images prepared by the process according to claim 67.

69. Process for the manufacture of the photopolymerisable material according to claim 41, characterised in that a solution containing
  a. at least one ethylenically unsaturated photopolymerisable monomer,
  b. a photo-initiator,
  c. a chemically hardenable, non-light-sensitive, swellable macromolecular compound and
  d. a hardener, and optionally
  e. a macromolecular compound which is chemically inert towards the components (c) and (d), is supplied to a carrier as a layer and dried.

* * * * *

UNITED STATES PATENT AND TRADEMARK OFFICE
CERTIFICATE OF CORRECTION

PATENT NO. : 4,043,819
DATED : August 23, 1977
INVENTOR(S) : Niklaus Baumann

It is certified that error appears in the above-identified patent and that said Letters Patent are hereby corrected as shown below:

Column 4, line 44, "concentratin" should be --concentration--

Column 6, line 13, "... $-O^{\oplus}$ ", should be --... $O^{\ominus}$ --.

Column 6, line 19, "7" should be --6--.

Column 8, line 61, "on" should be --of--.

Column 9, line 4, "aryklsulphuryl" should be --arylsulphuryl--

Column 10, line 11, "$X_1$-" should be --$X_1^{\ominus}$ --.

Column 10, line 13, "$X_2$-" should be --$X_2^{\ominus}$ --.

Column 11, line 49, "$X_1 31$" should be --$X_1^{\ominus}$ --.

Column 12, line 53, "vinylpyrrolione" should be --vinylpyrrolidone--.

Column 14, line 32, "$X^+$" should be --$X^{\ominus}$ --.

Column 15, line 17, "Compound" should be --Compounds--.

Column 15, line 31, insert --( )-- around "34".

Column 15, line 36, "heteroring" should be --hetero-ring--.

Column 15, line 36, "4ring" should be --4 ring--.

Column 16, line 19, "ae" should be --are--.

Column 16, line 50, "fomrula" should be --formula--.

Column 17, line 20, "is" should be --in--.

Column 17, line 37, "sillations" should be --silylations--.

UNITED STATES PATENT AND TRADEMARK OFFICE
CERTIFICATE OF CORRECTION

PATENT NO. : 4,043,819
DATED : August 23, 1977
INVENTOR(S) : Niklaus Baumann

It is certified that error appears in the above-identified patent and that said Letters Patent are hereby corrected as shown below:

Column 22, line 7, "shown" should be --show--

Column 23 $R_3$, 5 down, "O-$CH_2$-$CH_2$-O" should be moved to the left.

Column 23 - $R_3$, move "O-$CH_2$-$CH_2$-O" to the left under $R_3$

Column 23- $R_3$, move "O-$CH_2$-O" to the left.

Column 23- $R_3$, move "O-$CH_2$-O" to the left.

Column 25- $R_3$, move "O-$CH_2$-O" to the left.

Column 25- $R_3$, move "O-$CH_2$-O" to the left.

Column 25- $R_3$, move "O-$CH_2$-O" to the left.

Column 25- $R_3$, move "O-$CH_2$-$CH_2$-O" to the left.

Column 25- $R_3$, move $R_3$ equations to the left.

Column 25- $R_3$, move $R_3$ equations to the left.

Column 25- $R_3$, move $R_3$ equations to the left.

Column 29, line 7, "$5.7.10^3$, should be --$5.7.10^{-3}$"

UNITED STATES PATENT AND TRADEMARK OFFICE
CERTIFICATE OF CORRECTION

PATENT NO. : 4,043,819
DATED : August 23, 1977
INVENTOR(S) : Niklaus Baumann

It is certified that error appears in the above—identified patent and that said Letters Patent are hereby corrected as shown below:

Column 30, line 5, "O⁻" should be --O⁻--.

Column 32, line 13, "fro." should be ''--for--.

Column 37, line 17, "properities" should be --properties--.

Column 37, line 61, "Mg" should be --mg--.

Column 38, line 15, "photoinitiator" should be --photo-initiator --.

Column 40, line 40, delete mark after "group" 2nd occurrence and insert --,--.

Column 41, line 17, "-N⁺" should be -- -N⁺ --

Column 42, line 52, "th" should be --the--.

Column 44, line 45, "triazone" should be --triazine--.

Column 46, line 14, "fnctionally" should be --functionally--.

Column 46, line 48, "aralyky" should be --aralkyl--.

Column 46, line 60, "aralyl" should be --aralkyl--.

Column 47, line 10, "prefferably" should be --preferably--.

Column 47, line 40, "quaternished" should be --quaternised--.

Column 48, line 49, "R'" should be -- $R'_1$ --.

Column 48, line 64, "Photoplymerisable" should be -- Photopolymerisable --.

Column 51, line 47, "triacylamides" should be --triacrylamides--

UNITED STATES PATENT AND TRADEMARK OFFICE
CERTIFICATE OF CORRECTION

PATENT NO. : 4,043,819
DATED : August 23, 1977
INVENTOR(S) : Niklaus Baumann

It is certified that error appears in the above-identified patent and that said Letters Patent are hereby corrected as shown below:

Column 52, line 14, "N-acrylamide," should read -- N-octylacrylamide, --.

Column 52, line 15, "acylamide" should be --acrylamide--.

Column 52, line 62-63, "supplied" should be --applied--.

Signed and Sealed this

Tenth Day of January 1978

[SEAL]

Attest:

RUTH C. MASON
Attesting Officer

LUTRELLE F. PARKER
Acting Commissioner of Patents and Trademarks